(12) United States Patent
Huang et al.

(10) Patent No.: US 11,295,990 B2
(45) Date of Patent: Apr. 5, 2022

(54) METHODS OF FORMING METAL GATES

(71) Applicant: Taiwan Semiconductor Manufacturing Co., Ltd., Hsin-Chu (TW)

(72) Inventors: Ju-Li Huang, Nantou County (TW); Hsin-Che Chiang, Hsinchu (TW); Ju-Yuan Tzeng, Hsinchu (TW); Wei-Ze Xu, Hsinchu (TW); Yueh-Yi Chen, Hsinchu (TW); Shu-Hui Wang, Hsinchu (TW); Shih-Hsun Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 269 days.

(21) Appl. No.: 16/735,184

(22) Filed: Jan. 6, 2020

(65) Prior Publication Data

US 2020/0152521 A1    May 14, 2020

Related U.S. Application Data

(62) Division of application No. 15/966,299, filed on Apr. 30, 2018, now Pat. No. 10,529,629.

(51) Int. Cl.
*H01L 21/8238* (2006.01)
*H01L 27/092* (2006.01)
(Continued)

(52) U.S. Cl.
CPC .......... *H01L 21/823857* (2013.01); *H01L 21/02181* (2013.01); *H01L 21/02192* (2013.01);
(Continued)

(58) Field of Classification Search
CPC ....... H01L 21/823857; H01L 21/02181; H01L 21/02192; H01L 21/28088;
(Continued)

(56) References Cited

U.S. PATENT DOCUMENTS 7,732,346 B2    6/2010  Hsu et al.
7,816,671 B2 *  10/2010  Park ...................... C07F 9/2429
                                                    257/40
(Continued)

OTHER PUBLICATIONS

U.S. Appl. No. 10/170,317, filed Jan. 1, 2019, Huang et al.
(Continued)

*Primary Examiner* — Thao X Le
*Assistant Examiner* — Gardner W. S. Swan
(74) *Attorney, Agent, or Firm* — Haynes and Boone, LLP

(57) ABSTRACT

A method includes removing a dummy gate structure formed over a first fin and a second fin, forming an interfacial layer in the first trench and the second trench, forming a first high-k dielectric layer over the interfacial layer in the first trench and the second trench, removing the first high-k dielectric layer in the second trench, forming a self-assembled monolayer over the first high-k dielectric layer in the first trench, forming a second high-k dielectric layer over the self-assembled monolayer in the first trench and over the interfacial layer in the second trench, forming a work function metal layer in the first and the second trenches, and forming a bulk conductive layer over the work function metal layer in the first and the second trenches. In some embodiments, the first high-k dielectric layer includes lanthanum and oxygen.

20 Claims, 23 Drawing Sheets

(51) Int. Cl.
*H01L 29/49* (2006.01)
*H01L 29/51* (2006.01)
*H01L 29/66* (2006.01)
*H01L 21/02* (2006.01)
*H01L 21/28* (2006.01)
*H01L 21/311* (2006.01)

(52) U.S. Cl.
CPC .. *H01L 21/28088* (2013.01); *H01L 21/28238* (2013.01); *H01L 21/31111* (2013.01); *H01L 21/823821* (2013.01); *H01L 21/823842* (2013.01); *H01L 27/0924* (2013.01); *H01L 29/4966* (2013.01); *H01L 29/517* (2013.01); *H01L 29/66545* (2013.01)

(58) Field of Classification Search
CPC ......... H01L 21/28238; H01L 21/31111; H01L 21/823821; H01L 21/823842; H01L 21/022; H01L 21/0228; H01L 21/02304; H01L 21/02307; H01L 21/3105; H01L 21/32134; H01L 21/82345; H01L 21/823462; H01L 21/823431; H01L 21/823437; H01L 27/0924; H01L 29/4966; H01L 29/517; H01L 29/66545
USPC ....................................................... 257/369
See application file for complete search history.

(56) References Cited

U.S. PATENT DOCUMENTS

| | | |
|---|---|---|
| 8,048,733 B2 | 11/2011 | Yeh et al. |
| 8,361,855 B2 | 1/2013 | Yeh et al. |
| 8,415,254 B2 | 4/2013 | Yeh et al. |
| 8,487,378 B2 | 7/2013 | Goto et al. |
| 8,586,436 B2 | 11/2013 | Ng et al. |
| 8,729,634 B2 | 5/2014 | Shen et al. |
| 8,826,213 B1 | 9/2014 | Ho et al. |
| 8,887,106 B2 | 11/2014 | Ho et al. |
| 8,943,455 B2 | 1/2015 | Chen et al. |
| 9,337,192 B2 | 5/2016 | JangJian et al. |
| 9,431,304 B2 | 8/2016 | Huang et al. |
| 9,461,144 B2 | 10/2016 | Yeh et al. |
| 9,761,684 B2 | 9/2017 | Huang et al. |
| 10,361,133 B2 | 7/2019 | Huang et al. |
| 2013/0075831 A1 | 3/2013 | JangJian et al. |
| 2014/0282326 A1 | 9/2014 | Chen et al. |
| 2015/0364573 A1 | 12/2015 | Yeh et al. |

OTHER PUBLICATIONS

D. Brovelli, G. Hahner et al., "Highly Oriented, Self-Assembled Alkanephosphate Monolayers on Tantalum (V) Oxide Surfaces", 1999, pp. 4324-4327, vol. 15, Issue 13, Langmuir.

M. Textor, L. Ruiz et al., "Structured Chemistry of Self Assembled Monolayers of Octadecylphosphoric Acid on Tantalum Oxide Surfaces", 2000, pp. 3257-3271, vol. 16, Issue 7, Langmuir.

S. Tosatti, R. Michel et al., "Self-Assembled Monolayers of Dodecyl and Hydrozy-dodecyl Phosphates on Both Smooth and Rough Titanium Oxide Surfaces", 2002, pp. 3537-3548, vol. 18, Issue 9, Langmuir.

F.A. Pavan, M.S.P. Francisco et al., "Adsorption of phosphoric acid on niobium oxide coated cellulose fiber: Preparation, characterization and ion exchange property", 2005, pp. 815-820, vol. 16, Issue 4, Journal of the Brazilian Chemical Society.

M.L. Jespersen, C.E. Inman, G.J. Kearns, E.W. Foster and J.E. Hutchison, "Alkanephosphonates on Hafnium-Modified Gold: A New Class of Self-Assembled Organic Monolayers", 2007, pp. 2803-2807, vol. 129, Issue No. 10, Journal of American Chemical Society.

S. Guha, V.K. Paruchuri, M. Copel, V. Narayanan et al., "Examination of flatband and threshold voltage tuning of HfO2/TiN field effect transistors by dielectric cap layers", 2007, vol. 90, Issue 9, Applied Physics Letters.

K. V. Rao, T. Ngai, C. Hobbs, M. Rodgers, S. Vivekanand et al., "High-k metal-gate PMOS FinFET threshold voltage tuning with aluminum implantation", Nov. 2012, pp. 38-41, AIP Conference Proceedings.

X. Ji, D. Wu et al., "Fabrication of lanthanum-based phosphate binder using cross-linked alginate as a carrier", 2015, 10 pages, vol. 5, Issue 68, Royal Society of Chemistry.

* cited by examiner

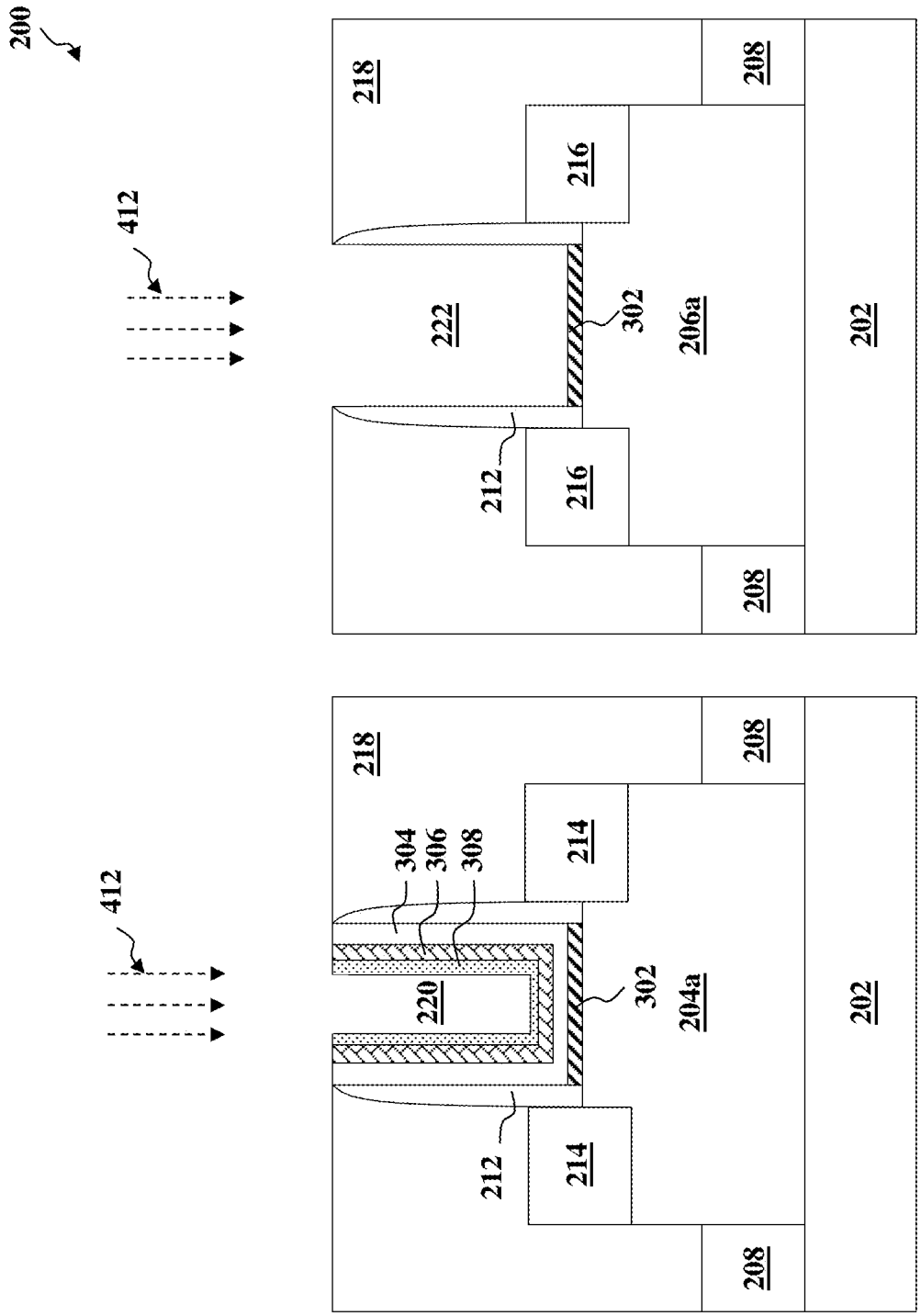

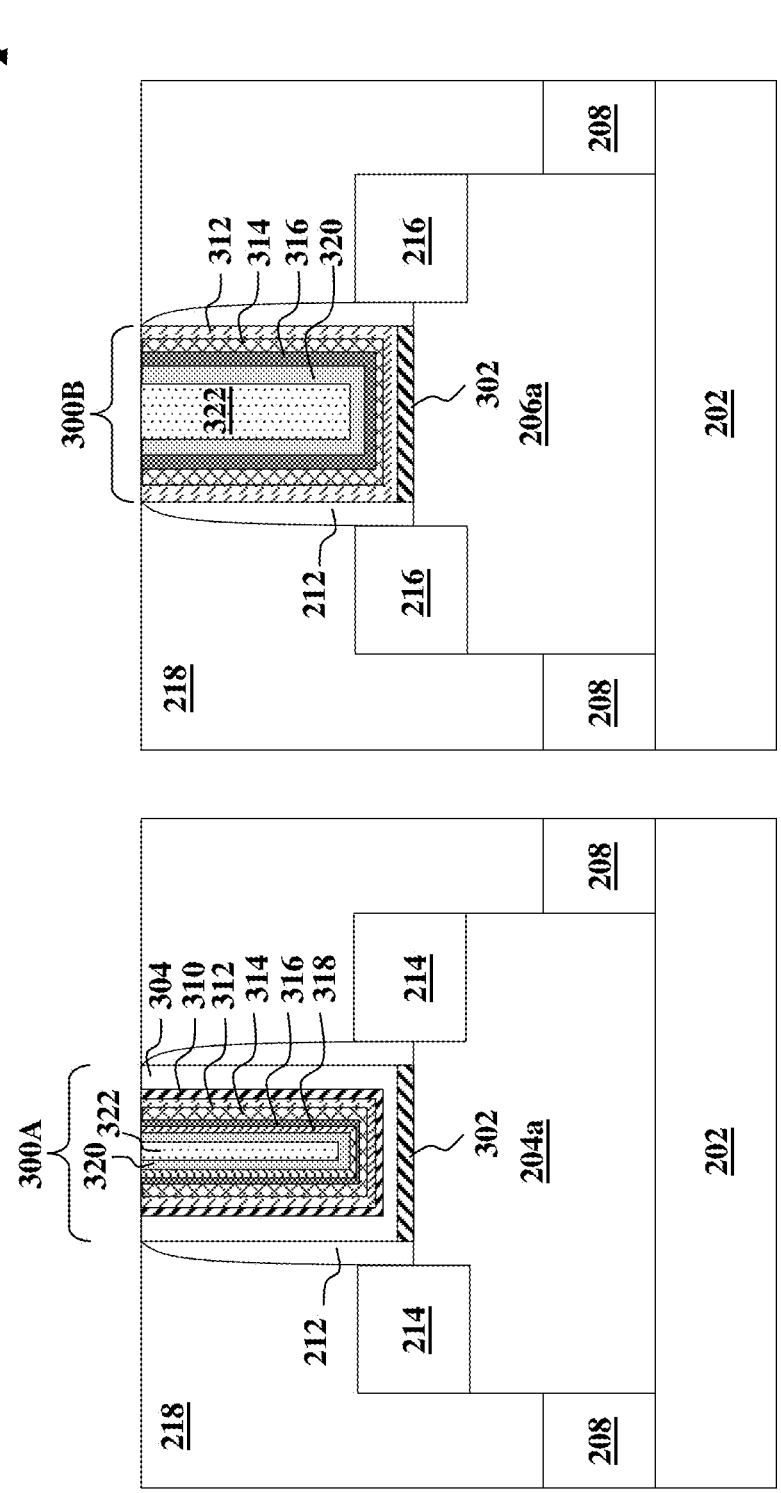

METHODS OF FORMING METAL GATES

CROSS-REFERENCE TO RELATED APPLICATIONS

This is a divisional patent application of U.S. patent application Ser. No. 15/966,299 filed Apr. 30, 2018, now U.S. Pat. No. 10,529,629, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a metal gate electrode instead of a polysilicon gate electrode. One process of forming a metal gate structure replaces a dummy polysilicon gate structure with the metal gate structure after other components of the device are fabricated. While this method of forming a metal gate structure has generally been adequate, challenges remain in implementing such fabrication process, especially with respect to improving device performance when feature sizes continue to decrease in FinFETs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, and 12A are cross-sectional views of an embodiment of the semiconductor device of FIG. 2 along line AA' during intermediate steps of an embodiment of the method of FIGS. 1A and 1B according to various aspects of the present disclosure.

FIGS. 3B, 4B, 5B, 6B, 7B, 8B, 9B, 10B, 11B, and 12B are cross-sectional views of an embodiment of the semiconductor device of FIG. 2 along line BB' during intermediate steps of an embodiment of the method of FIGS. 1A and 1B according to various aspects of the present disclosure.

DETAILED DESCRIPTION

Figure 1A:
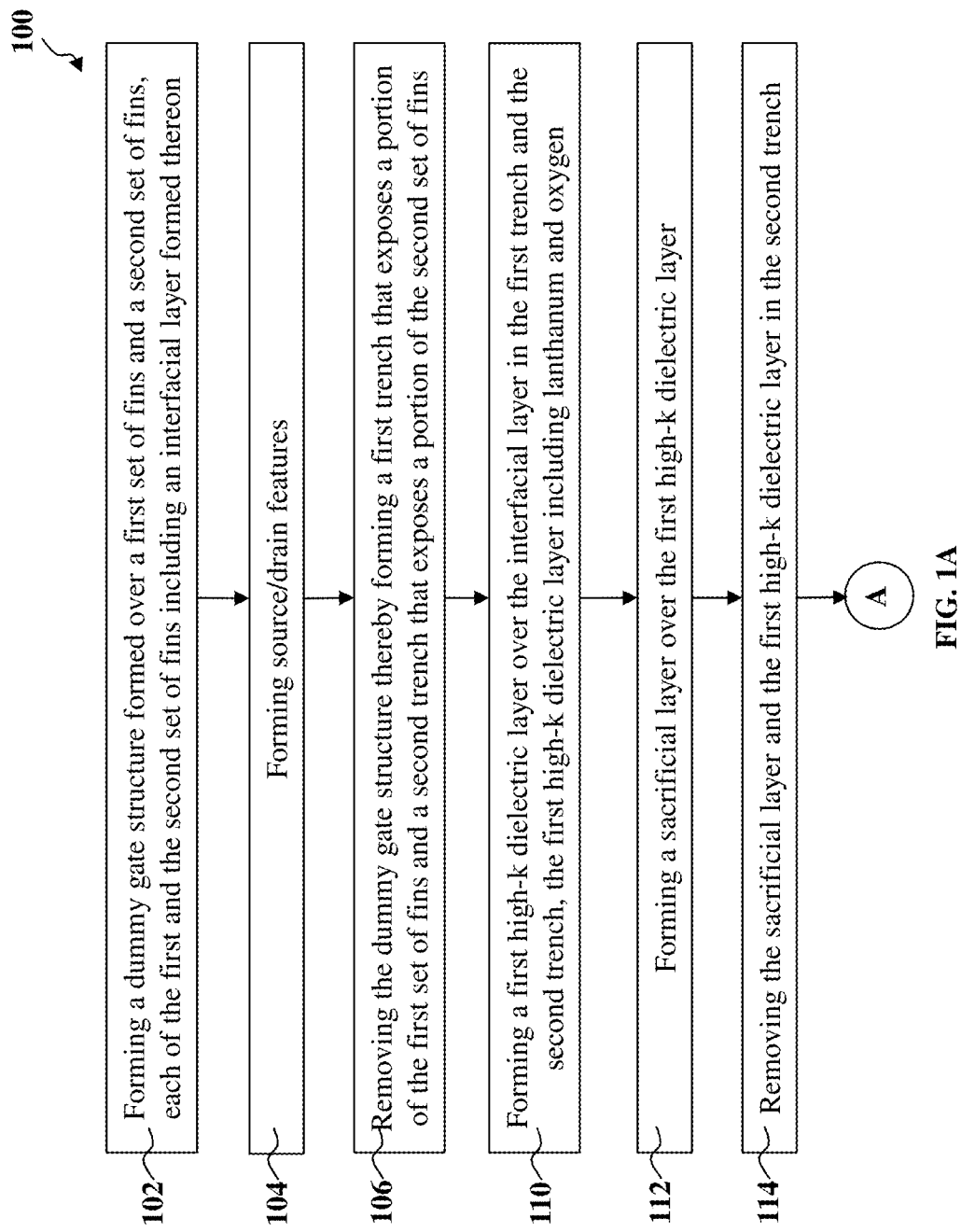
FIGS. 1A and 1B show a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to FinFETs. It is an objective of the present disclosure to provide high-k metal gates and methods of making the same during FinFET processes. In the present disclosure, "high-k" dielectric refers to one or more material used in a gate dielectric layer having a dielectric constant greater than that of silicon oxide ($SiO_2$).

During fabrication of a FinFET device, a gate replacement process may be implemented to reduce thermal budget associated with the fabrication steps. The gate replacement process termed "gate-last" may be performed in a series of steps. For example, during a gate-last process, a dummy gate structure is first formed over a substrate as a placeholder before forming other components, e.g., source/drain features, of the device. Once subsequent fabrication steps are completed, the dummy gate structure is removed to allow a metal gate structure to be formed in its place. Multiple patterning processes may be implemented to form various material layers within the metal gate structure to improve the overall performance of the device. In one example, modulating threshold voltage ($V_t$) of the device has been accomplished by incorporating various material layers (e.g., gate dielectric layers and/or work function metal layers) and adjusting their respective thickness in the metal gate structure. However, as channel lengths decrease, many challenges arise when patterning the various material layers of the metal gate structure. On one hand, directly patterning work function metal layers is limited due to merged metal films as a result of decreased channel lengths. On the other hand, directly patterning gate dielectric layers is limited due to $V_t$ instability introduced when forming the gate dielectric layer in a thermal driven-in process. Consequently, the present disclosure contemplates methods of forming and patterning metal gate structures that allow modulation of threshold voltage in devices with reduced features sizes.

Referring now to FIG. 1, a flow chart of a method 100 of forming a semiconductor device 200 is illustrated according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2 and 3A-12C, which illustrate a portion of the semiconductor device 200 during the method 100. FIGS. 3A, 4A, 5A, 6A, 7A, 8A, 9A, 10A, 11A, and 12A are fragmentary cross-sectional views of the device 200 taken along line AA' at intermediate steps of the method 100. FIGS. 3B, 4B, 5B, 6B, 7B, 8B, 9B, 10B, 11B, and 12B are fragmentary cross-sectional views of the device 200 taken along line BB' at intermediate steps of the method 100. FIGS. 3C, 4C, 5C, 6C, 7C, 8C, 9C, 10C, 11C, and 12C are fragmentary cross-sectional views of the device 200 taken along line CC' at intermediate steps of the method 100. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOS-FET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 1B:
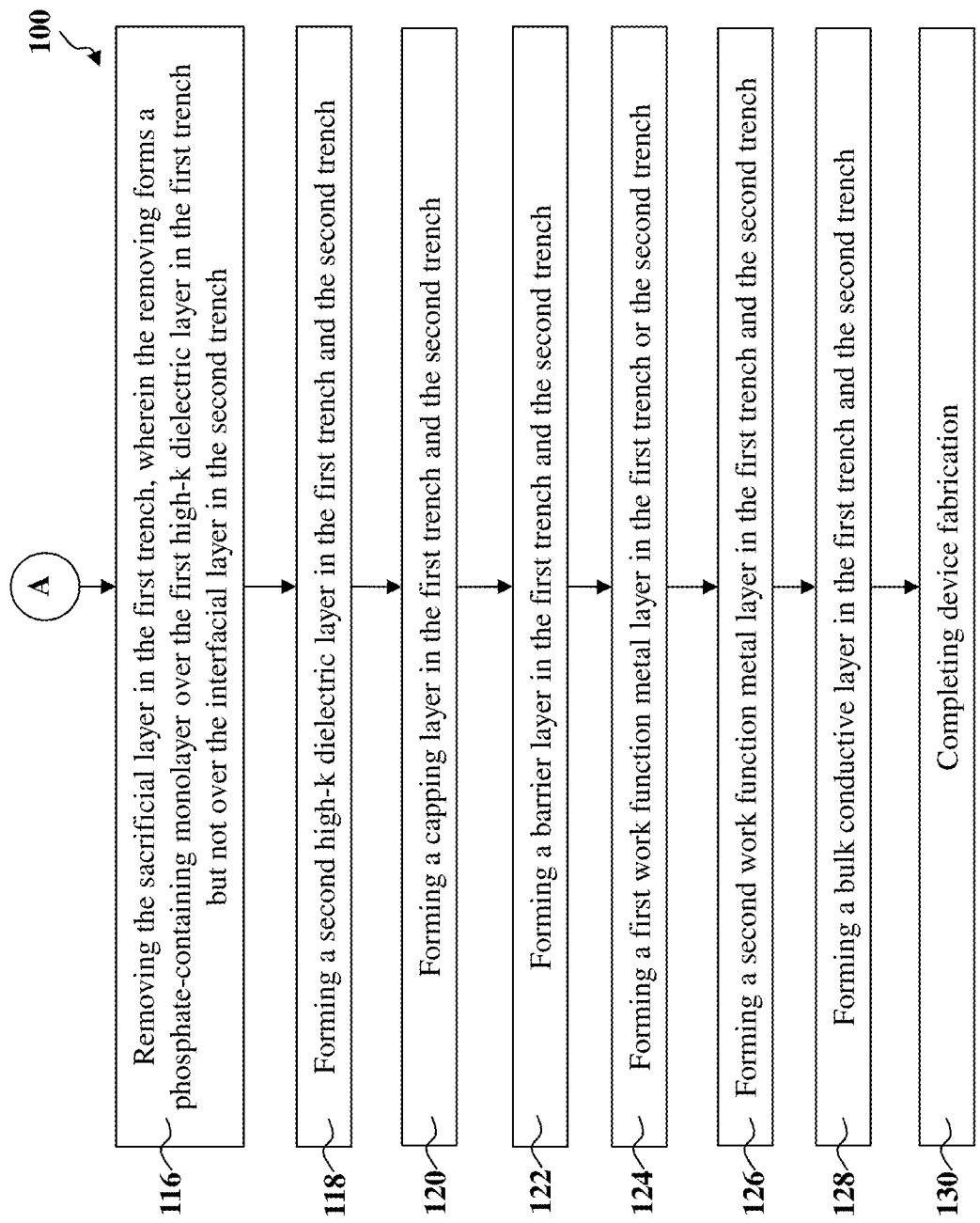
Figure 2:
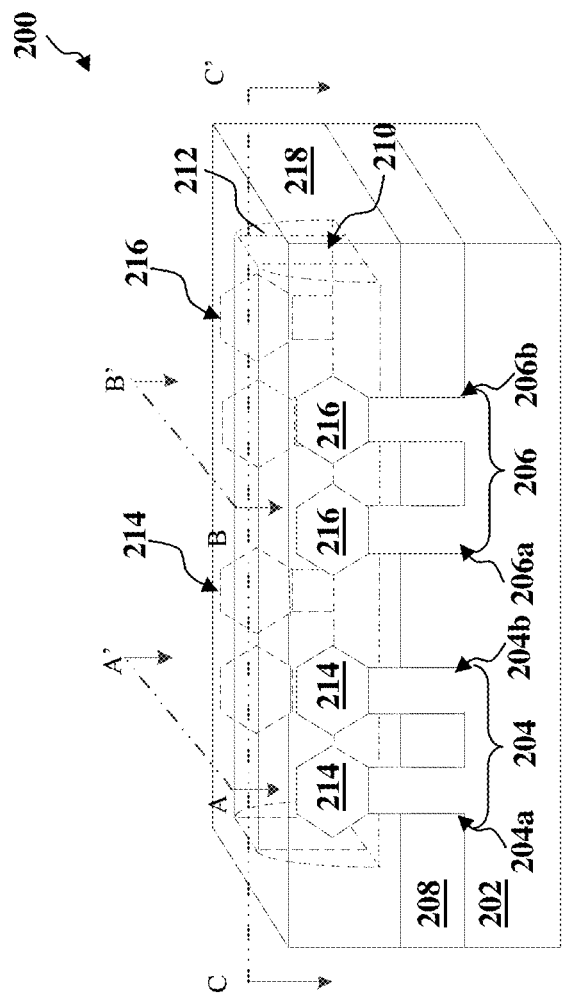
FIG. 2 is a perspective view of an embodiment of a semiconductor device according to various aspects of the present disclosure.

At operation 102, referring to FIGS. 1A and FIG. 2, the method 100 provides an FET device 200 including a substrate 202 having a first region 204 and a second region 206 formed thereon, a dummy gate structure 210 formed over the first region 204 and the second region 206, and isolation structures 208 formed over the substrate 202 separating various components of the device 200. In many embodiments, the first region 204 includes two fins, fin 204a and fin 204b, while the second region 206 includes two fins, fin 206a and fin 206b. For purpose of simplicity, intermediate steps of the method 100 are hereafter described with reference to cross-sectional views (FIGS. 3A-12C) of the device 200 taken along a fin length direction of the fins 204a (i.e., the line AA') and 206a (i.e., the line BB'), as well as across a channel region of the fins 204a and fin 204b and the fins 206a and 206b. In the present disclosure, the intermediate steps of the method 100 are not illustrated with respect to the fins 204b and 206b for purpose of simplicity, as they undergo the same fabrication processes as their counterparts of the same region.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonideor, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIG. 2, the first region 204 may be suitable for forming an n-type FinFET, and the second region 206 may be suitable for forming a p-type FinFET. In alternative embodiments, the first region 204 and the second region 206 may be suitable for forming FinFETs of a similar type, i.e., both n-type or both p-type, with different threshold voltage ($V_t$) design requirements. This configuration is for illustrative purposes only and does not limit the present disclosure. The fins 204a and 204b and the fins 206a and 206b may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204a and 204b and the fins 206a and 206b on the substrate 202. The etching process may include dry etching, wet etching, reactive ion etching (RIE), and/or other suitable processes.

Numerous other embodiments of methods for forming the fins 204a and 204b and the fins 206a and 206b may be suitable. For example, the fins 204a and 204b and the fins 206a and 206b may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204a and 204b and the fins 206a and 206b. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers.

Thereafter, referring to FIG. 2, the method at operation 102 forms a dummy gate structure 210 that engages the fins 204a and 204b and the fins 206a and 206b on three sides to form a channel region in each of the fins. In at least one embodiment, portions of the dummy gate structure 210 will be replaced with a high-k metal gate structure (HK MG) after other components of the device 200 are fabricated. The dummy gate structure 210 may include one or more material layers, such as an interfacial layer 302 over the fins 204a and 204b and the fins 206a and 206b, a poly-silicon layer over the interfacial layer, a hard mask layer, a capping layer, and/or other suitable layers. In many embodiments, the interfacial layer 302 remains over the fins 204a and 204b and the fins 206a and 206b after portions of the dummy gate structure 210 are replaced with the HK MG. The interfacial layer 302 may include a dielectric material such as silicon oxide ($SiO_2$) or silicon oxynitride (SiON). The interfacial layer 302 may be formed to any thickness such as less than about 5 Angstroms. In at least one embodiment, the interfacial layer 302 has a thickness of about 2 Angstroms. Each of the material layers in the dummy gate structure 210 may be formed by any suitable deposition techniques, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), low-pressure CVD (LP-CVD), atomic layer CVD (AL-CVD), atmospheric pressure CVD (AP-CVD), and/or other suitable methods. In one embodiment, the dummy gate structure 210 is first deposited as a blanket layer. The blanket layer is then patterned through a series of lithography and etching processes, thereby removing portions of the blanket layer and keeping the remaining portions over the isolation structures 208 and the fins 204a and 204b and the fins 206a and 206b as the dummy gate structure 210.

The method 100 at operation 102 subsequently forms gate spacers 212 on sidewalls of the dummy gate structure 210. The gate spacers 212 may include a material different from the material(s) included in the dummy gate structure 210. In at least one embodiment, the gate spacers 212 include a dielectric material, such as silicon oxide, silicon nitride, silicon carbide, silicon oxynitride, and/or other suitable dielectric materials. The gate spacers 212 may be a single layered structure or a multi-layered structure. The method 100 may form the gate spacers 212 by first depositing a blanket of spacer material over the device 200, and then performing an anisotropic etching process to remove portions of the spacer material to form the gate spacers 212 on sidewalls of the dummy gate structure 210.

Referring still to FIGS. 1A and 2, the method 100 at operation 104 forms source/drain features 214 and 216. In at least one embodiment, the source/drain features 214 and 216 are formed in the fins 204a and 204b and the fins 206a and 206b, respectively, each being adjacent to the dummy gate structure 210. The source/drain features 214 and 216 may be formed by any suitable techniques, such as etching processes followed by one or more epitaxy processes. In one example, one or more etching processes are performed to remove portions of the fins 204a and 204b and the fins 206a and 206b to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the source/drain features 214 and 216 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant. In at least one embodiment, the source/drain features 214 include a p-type epitaxial material, while the source/drain features 216 include an n-type epitaxial material; however, the present disclosure is not limited herein.

Thereafter, the method 100 deposits a contact etch-stop layer (CESL; not shown) over the source/drain features 214 and 216 and then an interlayer dielectric (ILD) layer 218 over the device 200 (FIG. 2). The CESL may comprise silicon nitride, silicon oxynitride, silicon nitride with oxygen or carbon elements, and/or other materials, and may be formed by CVD, PVD, ALD, and/or other suitable methods. In some embodiment, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 218 may include a multi-layer structure having multiple dielectric materials. The ILD layer 218 may be formed by a deposition process such as, for example, CVD, PVD, ALD, HDP-CVD, MO-CVD, RP-CVD, PE-CVD, LP-CVD, AL-CVD, AP-CVD, plating, and/or other suitable methods. Subsequent to forming the ILD layer 218, a planarization process such as CMP may be performed such that a top portion of the dummy gate structure 210 is exposed.

Figure 3B:
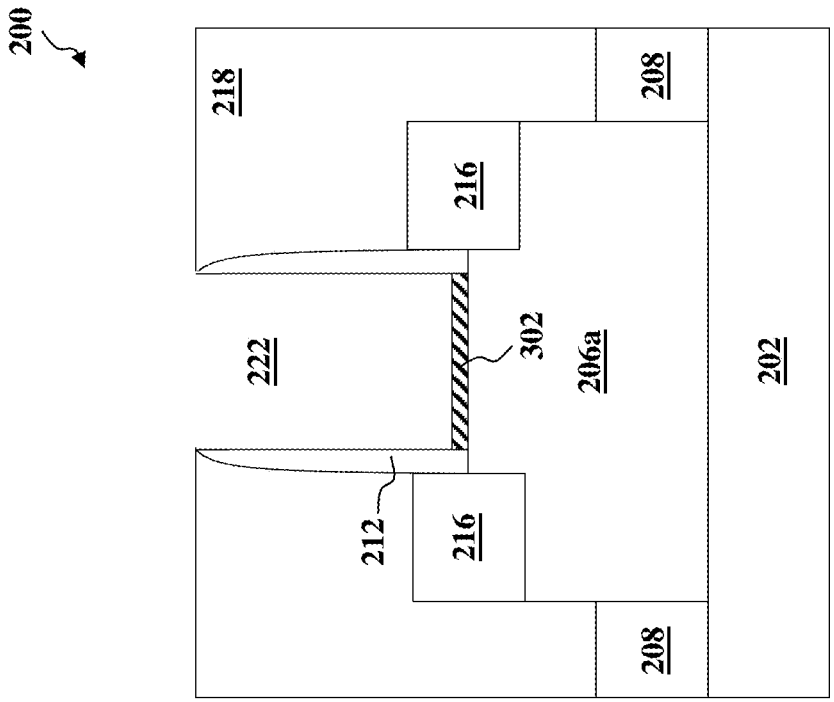
Figure 3A:
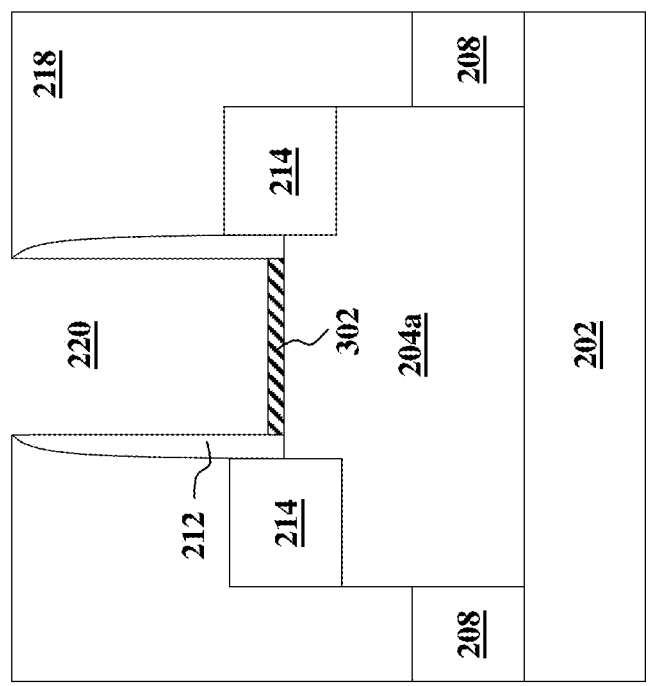
Figure 3C:
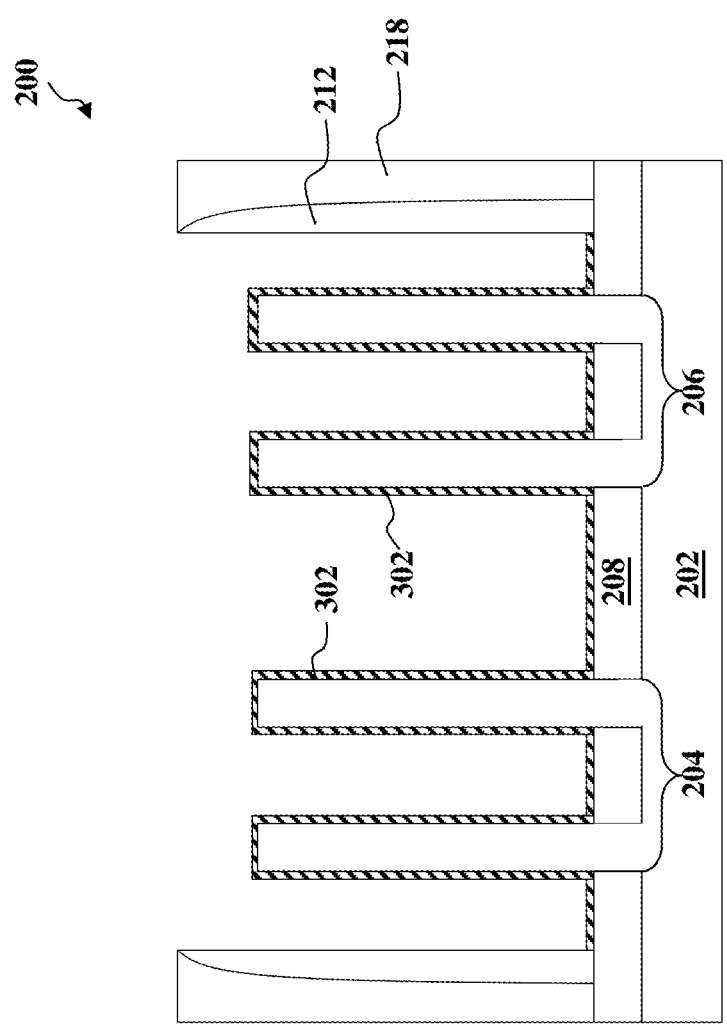
FIGS. 3C, 4C, 5C, 6C, 7C, 8C, 9C, 10C, 11C, and 12C are cross-sectional views of an embodiment of the semiconductor device of FIG. 2 along line CC' during intermediate steps of an embodiment of the method of FIGS. 1A and 1B according to various aspects of the present disclosure.

Referring still to FIGS. 1A and 3A-3C, the method 100 at operation 106 removes the dummy gate structure 210 to form a trench 220 over the fin 204a and a trench 222 over the fin 206a, thereby exposing the interfacial layer 302 formed over a portion (i.e., the channel region) of the fins 204a and 204b, and the fins 206a and 206b, respectively (FIGS. 3B and 3C). In some embodiments, forming the trenches 220 and 222 includes performing an etching process that selectively removes the dummy gate structure 210. The etching process may be a dry etching process, a wet etching process, an RIE, other suitable methods, or combinations thereof. For example, a dry etching process may use chlorine-containing gases, fluorine-containing gases, and/or other etching gases. The wet etching solutions may include ammonium hydroxide ($NH_4OH$), hydrofluoric acid (HF) or diluted HF, deionized water, tetramethylammonium hydroxide (TMAH), and/or other suitable wet etching solutions. The etching process may be tuned such that the etching of the dummy gate structure 210 is subjected to a higher etch rate relative to the CESL and the ILD layer 218.

Figure 4B:
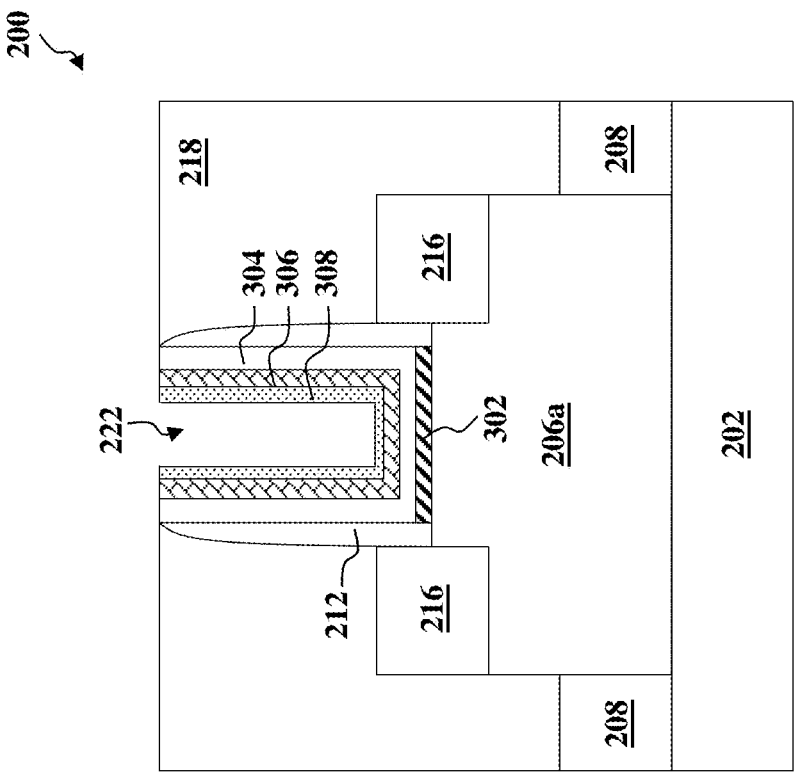

The method 100 proceeds to form a high-k metal gate structure (HK MG) in each of the trenches 220 and 222, such that the HK MG structure traverses a source region and a drain region (e.g., the source/drain regions 214 or the source/drain regions 216) of the fins 204a and 204b and the fins 206a and 206b. Referring back to FIG. 1A, the method 100 at operation 110 forms a high-k dielectric layer 304 over the interfacial layer 302 in the trench 220 (FIGS. 4A and 4C) and in the trench 222 (FIGS. 4B and 4C). The high-k dielectric layer 304 is configured to modulate the threshold value $V_t$ of the HK MG formed in the trenches 220 and 222, respectively. In at least one embodiment, the high-k dielectric layer 304 includes lanthanum and oxygen, such as lanthanum oxide ($La_2O_3$). The high-k dielectric layer 304 may be formed by ALD and/or other suitable methods to any suitable thickness. In an example embodiment, the high-k dielectric layer 304 has a thickness of about 2 Angstroms. Alternatively or additionally, the high-k dielectric layer 304 may be formed over any other material layer in the trenches 220 and 222 such that the high-k dielectric layer 304 is not directly formed on the interfacial layer 302. In some embodiments, the high-k dielectric layer 304 includes lanthanum, oxygen, hafnium, aluminum, titanium, zirconium, tantalum, silicon, and/or other suitable materials.

Figure 4A:
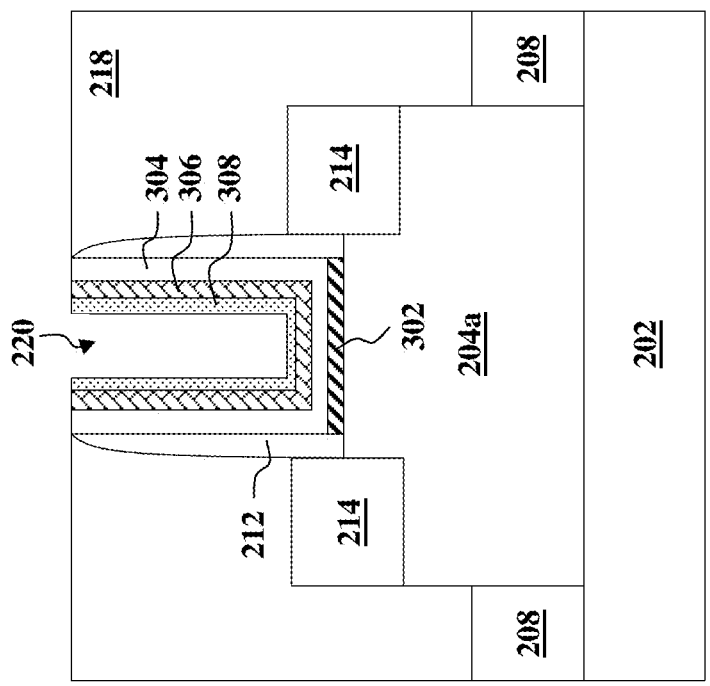
Figure 4C:
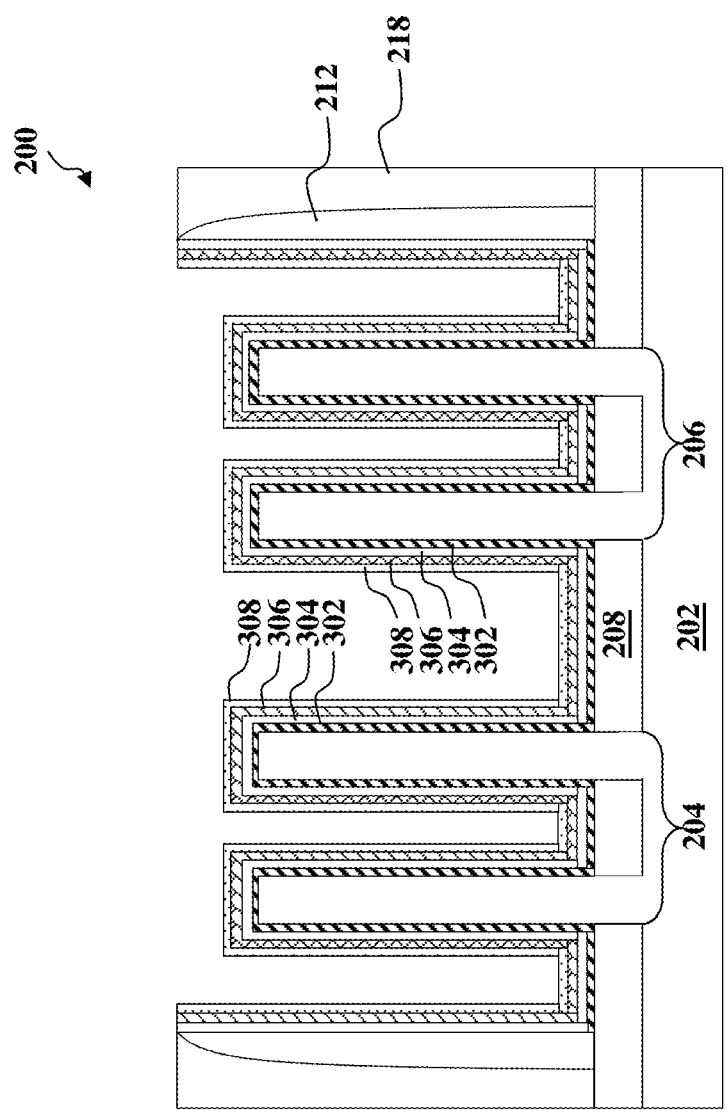

Still referring to FIGS. 4A, 4B, and 4C, the method 100 at operation 112 forms sacrificial layers 306 and 308 over the high-k dielectric layer 304 in the trenches 220 and 222. In many embodiments, the sacrificial layers 306 and 308 are configured to accommodate subsequently applied patterning processes and are then removed from the trenches 220 and 222 following the completion of the patterning processes. In an example, the sacrificial layer 306 may be configured to prevent the underlying material layers from being chemically contaminated by a subsequently formed resist layer (e.g., a photoresist layer) and/or a resist bottom layer such as a bottom antireflective coating (BARC), and may include a metal oxide, a metal nitride, a metal oxynitride, a metal carbide, and/or other suitable materials. In at least one embodiment, the sacrificial layer 306 includes aluminum and oxygen, such as aluminum oxide ($Al_2O_3$). In an example, the sacrificial layer 308 may be configured to promote adhesion between the underlying material layers (e.g., the high-k dielectric layer 304) and the subsequently formed resist layer and/or the bottom layer and may include a metal oxide, a metal nitride, a metal oxynitride, a metal carbide, other suitable materials, or combinations thereof. In at least one embodiment, the sacrificial layer 306 includes titanium and nitrogen, such as titanium nitride (TiN). In many embodiments, the device 200 includes either or both of the sacrificial layers 306 and 308. The sacrificial layer 306 and 308 may each be formed by a deposition process such as ALD and/or other suitable processes to any suitable thickness. In at least one embodiment, a thickness of the sacrificial layer 306 is similar to a thickness of the sacrificial layer 308 and is approximately 10 times that of the thickness of the high-k dielectric layer 304.

Figure 5B:
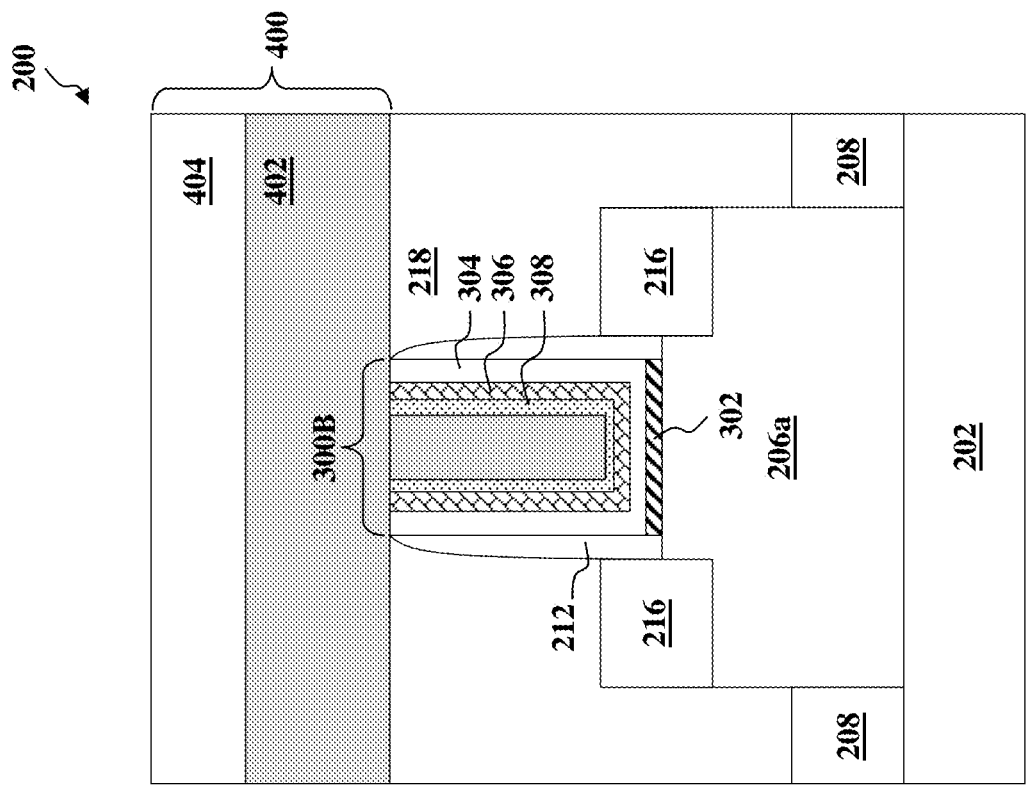
Figure 5A:
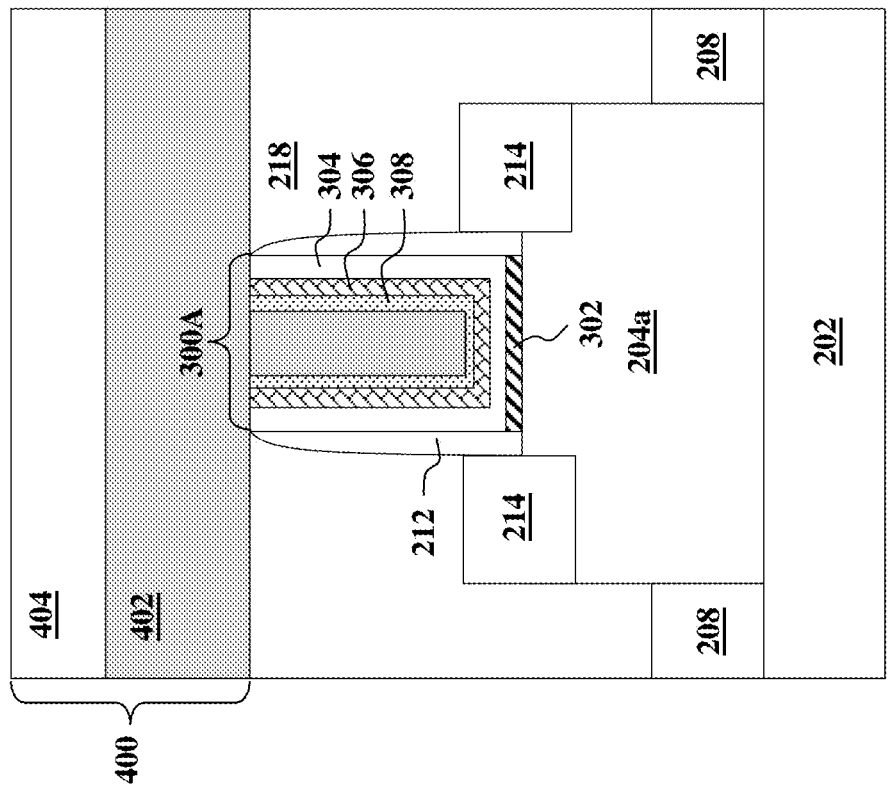
Figure 5C:
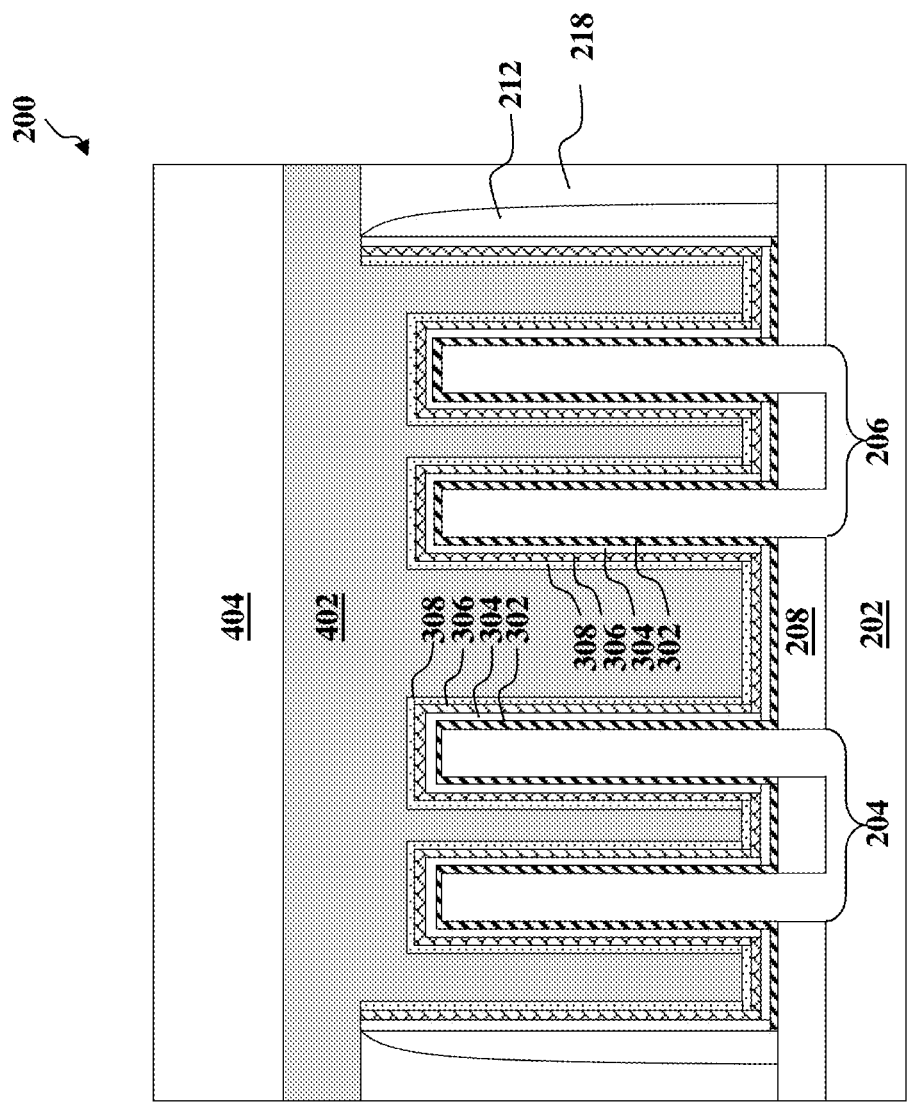

Referring back to FIG. 1A, the method 100 at operation 114 removes the high-k dielectric layer 304 in the trench 222 by a series of patterning and etching processes, leaving the high-k dielectric layer 304 in the trench 220. As shown in FIGS. 5A, 5B, and 5C, the method 100 may first form a masking element 400 that includes the resist layer 404 and optionally a bottom layer 402 (e.g., BARC) formed over the trenches 220 and 222 as well as portions of and the ILD layer 218. The method 100 then proceeds to form an opening 406 to expose material layers in the trench 222 (FIG. 6B and 6C) but not those in the trench 220 (FIG. 6A). The opening 406 may be formed by any suitable process including dry etching, wet etching, RIE, and/or other suitable processes. In at least one embodiment, the opening 406 is formed by a dry etching process utilizing a nitrogen-containing etchant gas (e.g., $N_2$), a hydrogen-containing etchant gas (e.g., $H_2$), a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, helium, and/or other suitable gases and/or plasmas. In at least one embodiment, the dry etching process implements a mixture of $N_2$ and $H_2$ gases.

Figure 6B:
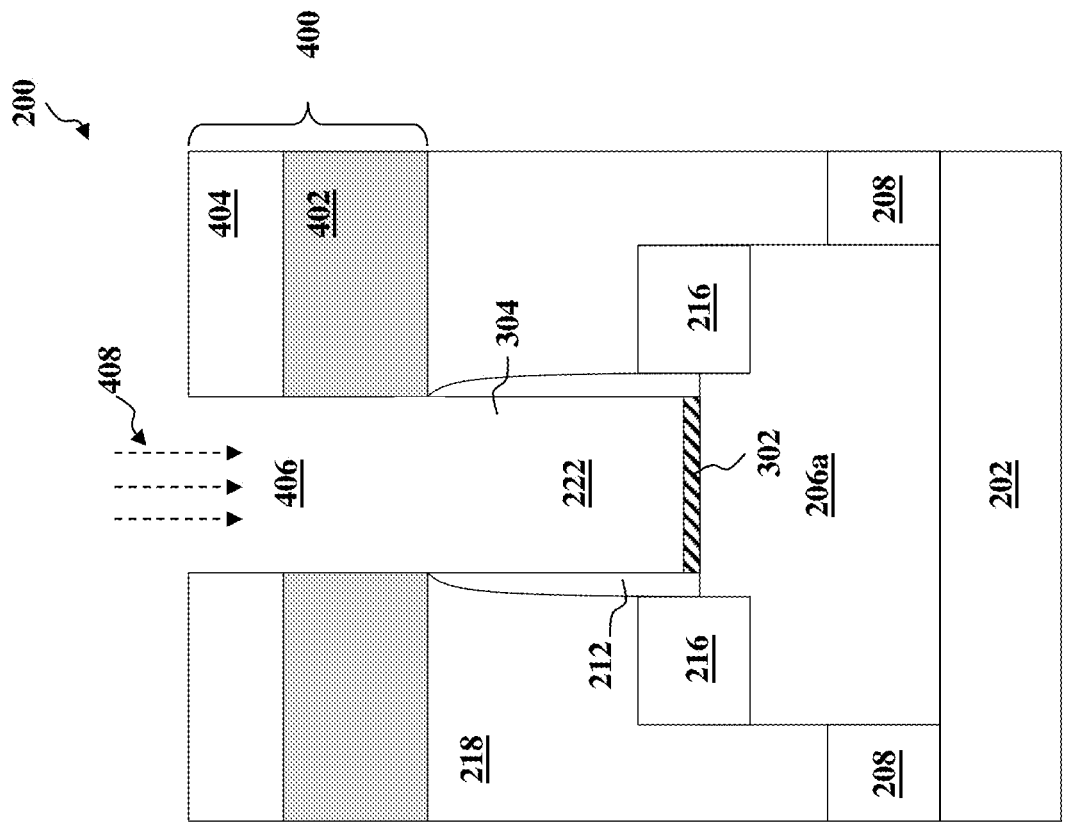
Figure 6A:
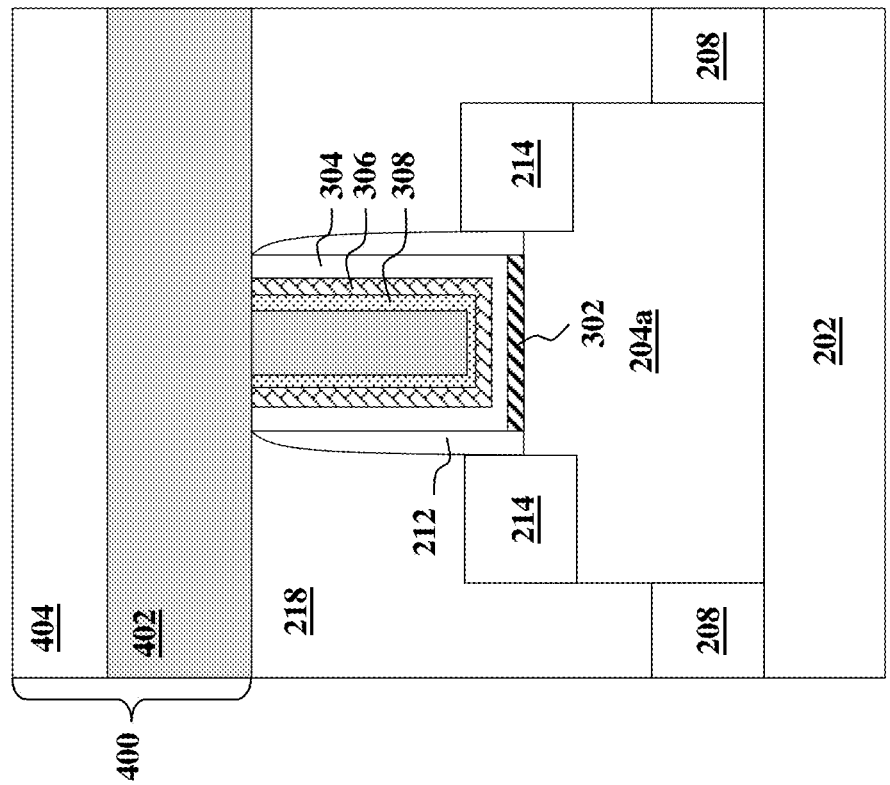
Figure 6C:
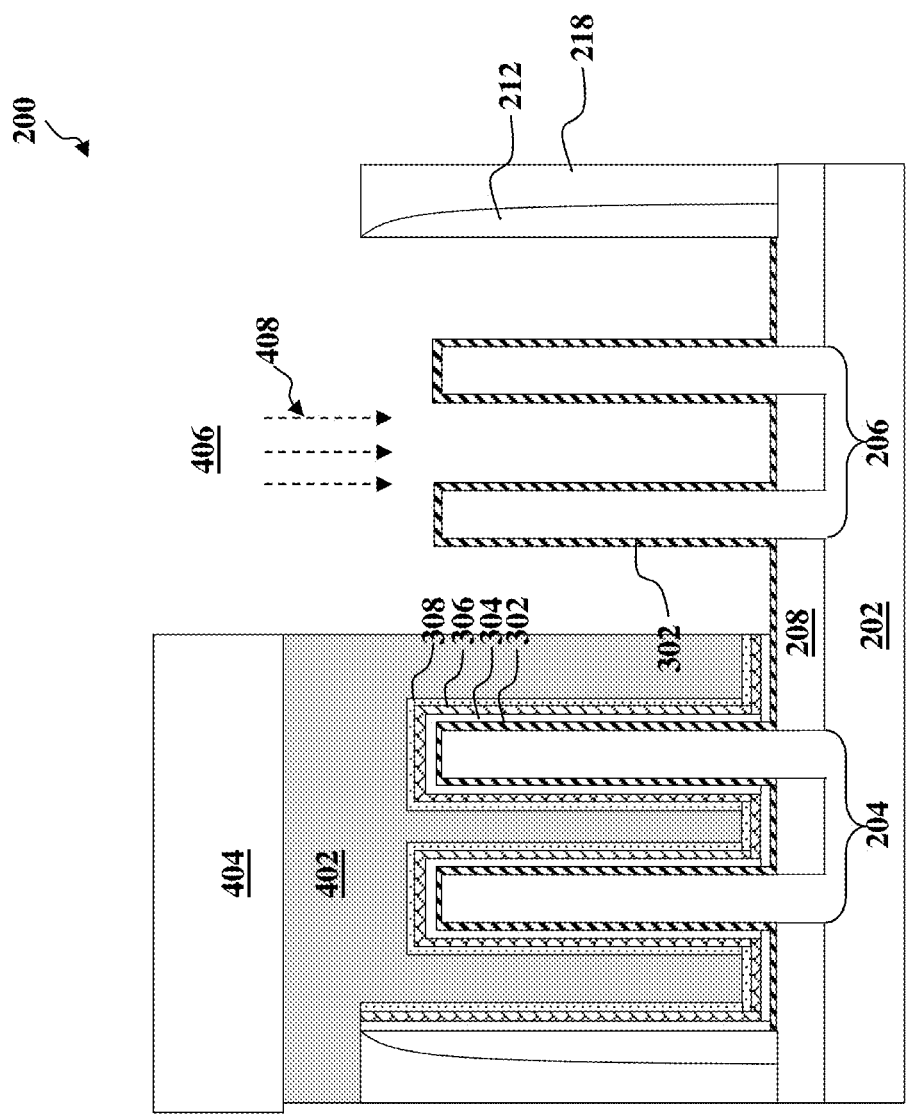
Figure 7A:
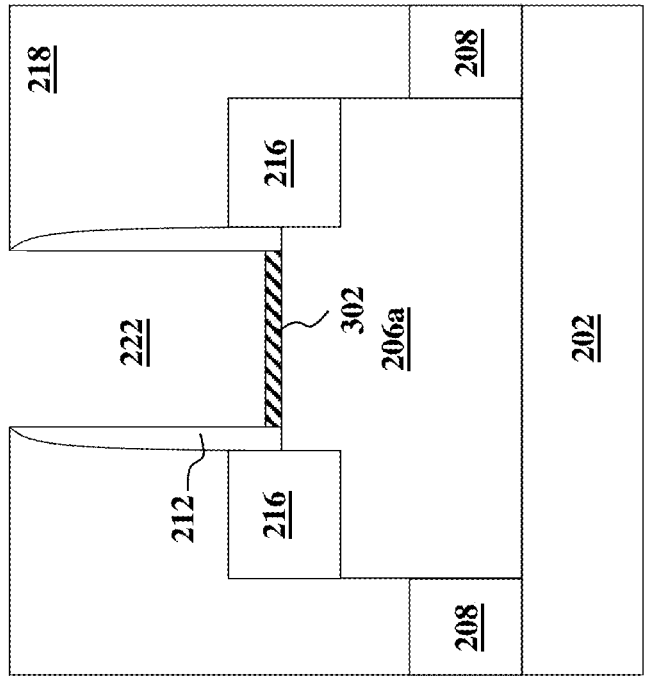
Figure 7B:
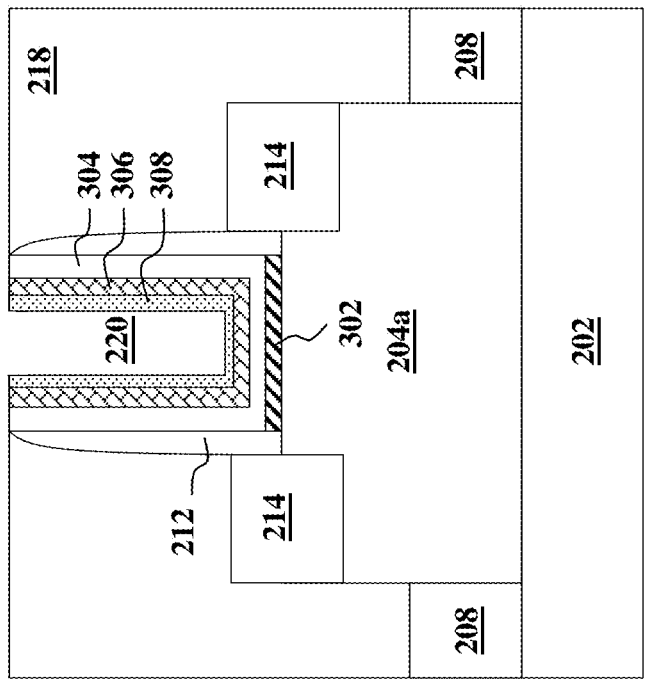
Figure 7C:
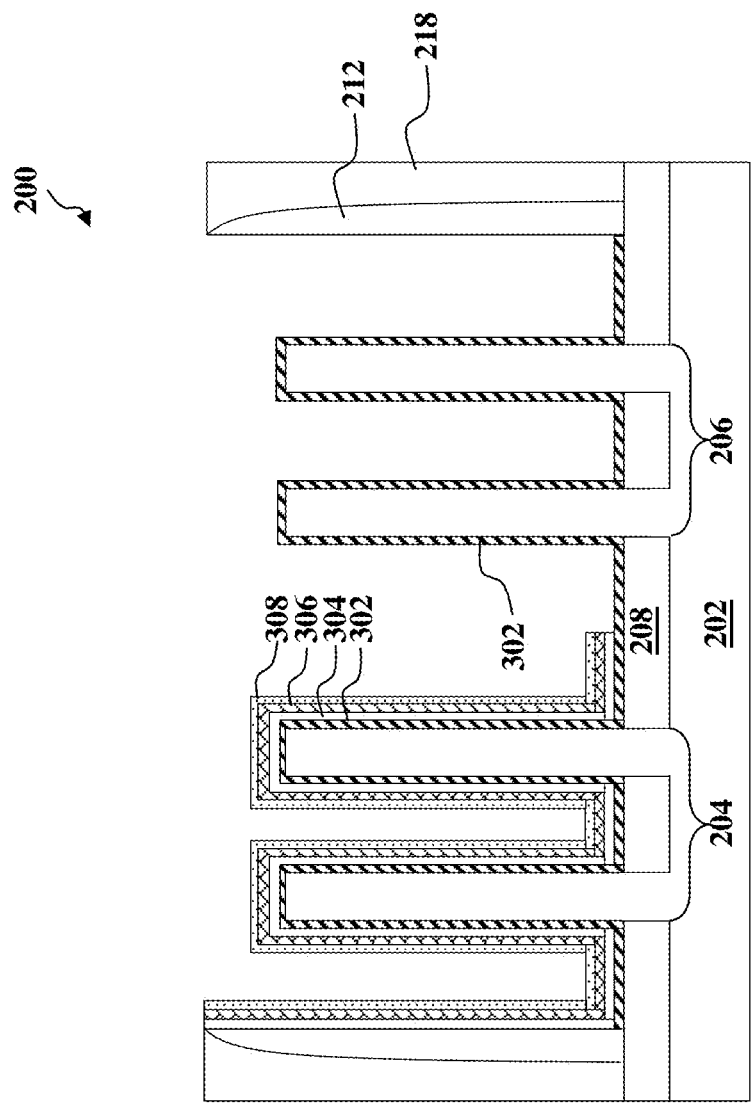

Still referring to FIGS. 6A, 6B, and 6C, the method 100 at operation 114 removes the high-k dielectric layer 304 and the sacrificial layers 306 and 308, but not the interfacial layer 302, in the trench 222 in a subsequent etching process. In at least one embodiment, the method 100 performs a wet etching process, though other etching processes may also be suitable. The wet etching process may be implemented using a wet etchant 408 such as hydrochloric acid (HCl), potassium hydroxide (KOH), ammonium hydroxide ($NH_4OH$), hydrogen peroxide ($H_2O_4$), sulfuric acid ($H_2SO_4$), nitric acid ($HNO_3$), hydrofluoric acid (HF), phosphoric acid ($H_3PO_4$), ammonium phosphate (($NH_4)_3PO_4$), tetramethylammonium hydroxide (TMAH), other suitable etchants, or combinations thereof. Alternatively or additionally, the wet etching process may utilize a mixture of solutions such as a standard-clean 1 (SC1; also known as an ammonia-peroxide mixture (APM)) mixture including $NH_4OH$, $H_2O_2$, and distilled water (DIW)), a standard-clean 2 (SC2) mixture including HCl, $H_2O_2$, and DIW, or a mixture of $H_2SO_4$, $H_2O_2$, and DIW. In at least one embodiment, the wet etchant 408 includes a SC2 mixture having a HCl: $H_2O_2$: DIW ratio of about 1:1:5 and is implemented at about 50 degrees Celsius. Thereafter, referring to FIGS. 7A, 7B, and 7C, the method 100 removes the masking element 400 from the device 200 by a suitable method such as resist stripping or plasma ashing. In at least one embodiment, the removal of the masking element 400 is implemented using a plasma that includes $N_2$ and/or $H_2$.

Figure 8C:
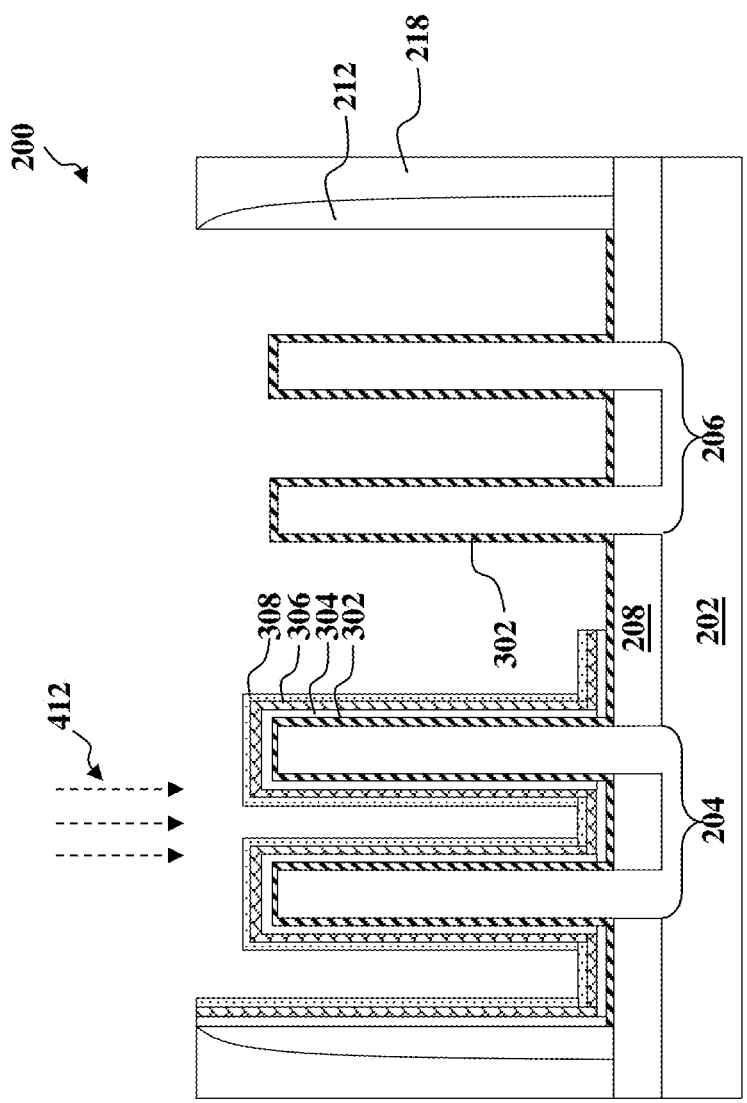

Referring back to FIG. 1B, the method 100 at operation 116 selectively removes the sacrificial layers 306 and 308 in the trench 220 without substantially removing the high-k dielectric layer 304 or interfacial layer 302 in the trench 220 and the trench 222. Referring to FIGS. 8A, 8B, and 8C, the method 100 removes the sacrificial layers 306 and 308 in the trench 220 in a wet etching process utilizing a wet etchant 412 similar to the wet etchant 408 described above. In an exemplary embodiment, the wet etchant 412 includes a phosphate-based aqueous solution, such as a $(NH_4)_3PO_4$ solution. In a further embodiment, the wet etchant 412 includes a mixture of $(NH_4)_3PO_4$ solution and other solutions such as $H_3PO_4$, $H_2O_2$, $HNO_3$, $H_2SO_4$, $NH_4OH$, HCl, HF, ozone ($O_3$), other acidic solutions, and/or organic oxidizers. In some embodiments, the concentration of the $(NH_4)_3PO_4$ solution is about 2 M (i.e., about 2 mol/L) and has a pH of about 11. In various embodiments, the wet etching process at operation 116 is performed at a temperature of between about 20 degrees Celsius and about 80 degrees Celsius. Notably, the wet etchant 412 demonstrates etching selectivity of the sacrificial layers 306 and 308 over the high-k dielectric layer 304 and the interfacial layer 302.

Thereafter, the method 100 at operation 116 implements a rinsing process to remove any excess wet etchant 412 from the device 200. In at least one embodiment, the rinsing process is implemented using one or more of the following solvents: DIW, distilled liquid carbon dioxide (DI-$CO_2$), and diluted $NH_4OH$. Other solvents may also be implemented for the rinsing process described herein. Subsequently, the method 100 performs a drying process to the device 200 by implementing one of a spin drying process in the presence of nitrogen or a solvent drying process using an alcohol such as iso-propyl alcohol (IPA) at a temperature of between about 20 degrees Celsius and about 80 degrees Celsius. Other methods of drying may also be implemented.

Figure 9A:
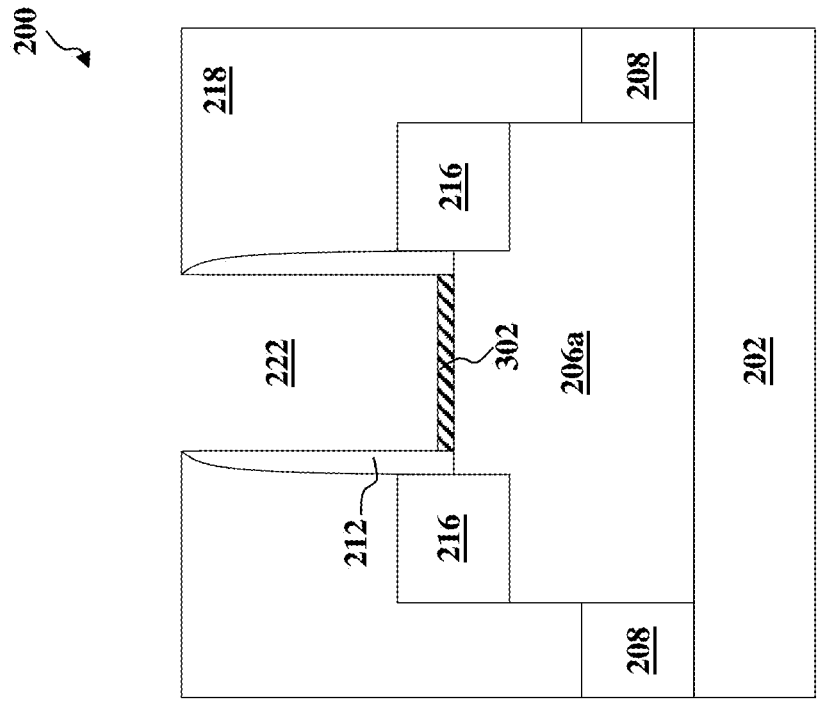
Figure 9B:
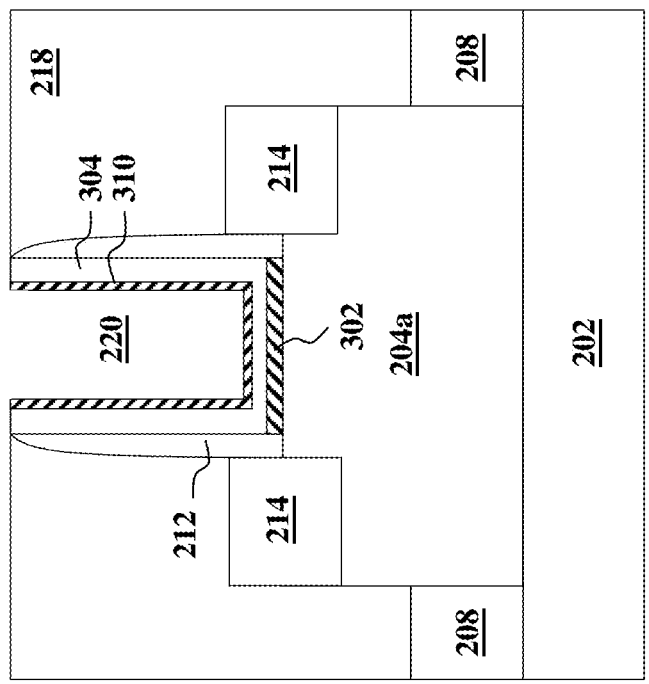
Figure 9C:
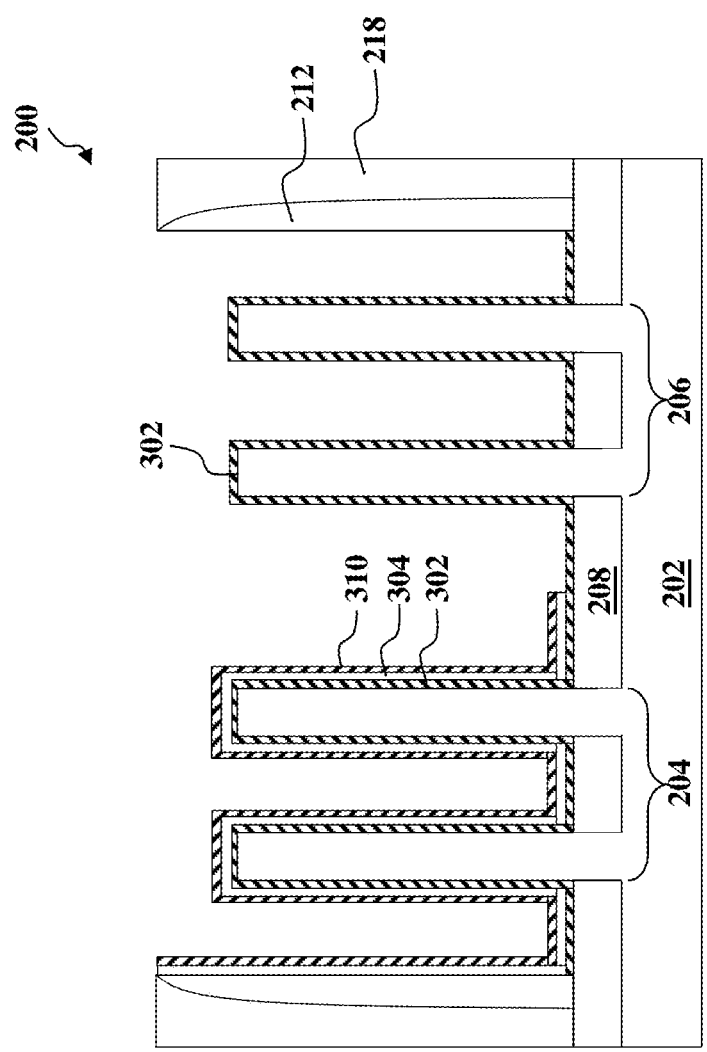

In at least one embodiment, referring to FIGS. 9A and 9C, the removing of the sacrificial layers 306 and 308 at operation 116 also forms a phosphate-containing monolayer 310 on the high-k dielectric layer 304 in the trench 220. Specifically, upon the removal of the sacrificial layers 306 and 308, phosphate ligands (e.g., $(PO_4)^{3-}$ functional groups) dissolved in the wet etchant 412 (e.g., the $(NH_4)_3PO_4$ solution) self-assemble (thus, the phosphate-containing monolayer 310 is alternatively referred to as a self-assembled monolayer, or SAM) on the surface of the high-k dielectric layer 304, which in at least one embodiment includes $La_2O_3$. As such, the phosphate-containing monolayer 310 may be formed using an existing wet etching apparatus while performing an etching of the sacrificial layers 306 and 308.

In many embodiments, the phosphate ligands adsorb onto the surface of the high-k dielectric layer 304 such that the oxygen moieties in the phosphate ligands form coordinated bonds with the metallic ions (e.g., lanthanum ions) as illustrated below. As a result, the phosphate ligands form the phosphate-containing monolayer 310 at the surface of the high-k dielectric layer 304 by a chelating process with the phosphate ligands acting as the chelating agents. In one example, only one oxygen moiety of each phosphate ligand forms a coordinated bond (i.e., a mono-dentate complex) with each lanthanum ion. In another example, more than one oxygen moiety of a phosphate ligand may be coordinated to each lanthanum ion and form bi- or poly-dentate complexes at the surface of the high-k dielectric layer 304. The phosphate-containing monolayer 310 may be formed to any thickness by the chelating process described herein. In at least one embodiment, the phosphate-containing monolayer 310 is formed to a thickness t similar to a height of one phosphate-containing monolayer as illustrated below. Because the phosphate-containing monolayer 310 is configured as a bonding agent between the high-k dielectric layer 304 and another high-k dielectric layer (e.g., the high-k dielectric layer 312; discussed below), one such monolayer is formed in the trench 220 in an effort to minimize its thickness, thereby enlarging a processing window for the subsequently formed metal gate electrode. In an example embodiment, the thickness t is about 1 Angstrom to about 2 Angstroms. Of course, additional phosphate-containing monolayer 310 may be formed in the trench 220 if desired. In at least one embodiment, as shown in FIGS. 9B and 9C, the phosphate-containing monolayer 310 is not formed in the trench 222.

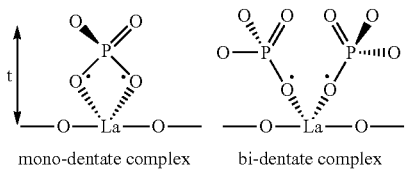

mono-dentate complex    bi-dentate complex

Figure 10A:
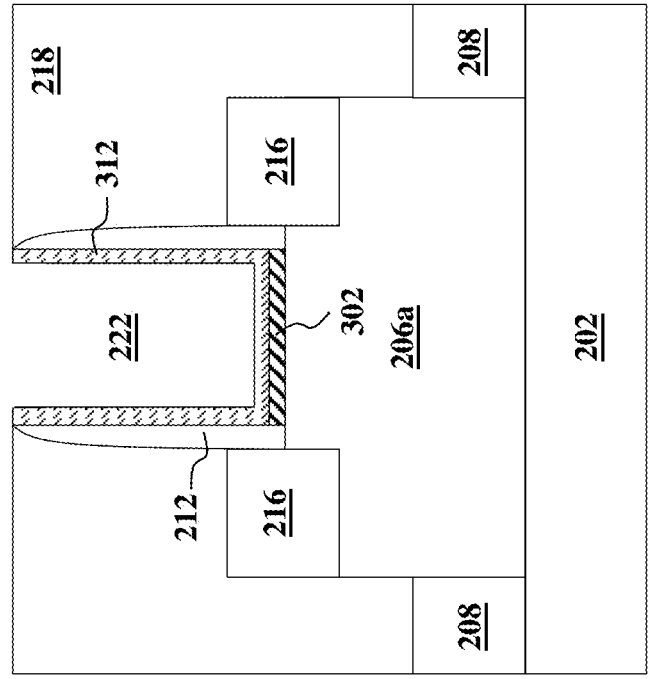
Figure 10B:
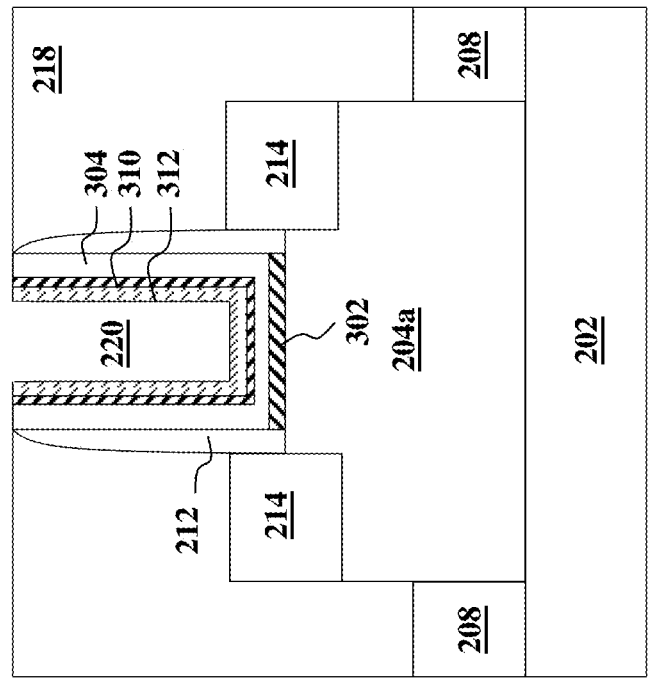
Figure 10C:
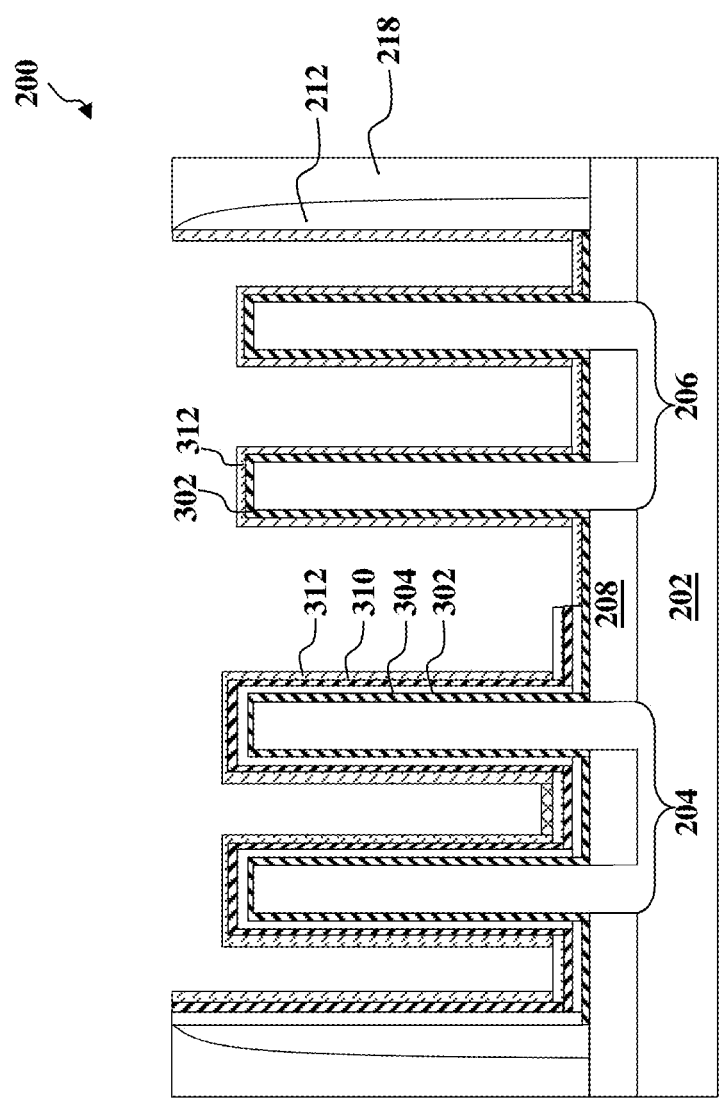

Referring back to FIG. 1B, the method 100 at operation 118 forms a high-k dielectric layer 312 over the phosphate-containing monolayer 310 in the trench 220 (FIGS. 10A and 10C) and over the interfacial layer 302 in the trench 222 (FIGS. 10B and 10C). In the present embodiment, the high-k dielectric layer 312 includes a dielectric material comprising hafnium, oxygen, lanthanum, aluminum, titanium, zirconium, tantalum, silicon, other suitable materials, or combinations thereof. In at least one embodiment, the high-k dielectric layer 312 includes hafnium oxide, such as $HfO_2$. The high-k dielectric layer 312 may be formed by ALD and/or other suitable methods to any suitable thickness, such as less than 20 Angstroms. In at least one embodiment, the high-k dielectric layer 312 has a thickness of about 15 Angstroms.

In at least one embodiment, the phosphate ligands included in the phosphate-containing monolayer 310 form coordinated bonds with metallic ions of the high-k dielectric layer 312 (e.g., hafnium ions) during a chelating process similar to that described with respect to the formation process of the phosphate-containing monolayer 310 at operation 116. In an exemplary embodiment, one oxygen moiety of each phosphate ligand forms a coordinated bond (i.e., a mono-dentate complex) with each hafnium ion as illustrated below. In another embodiment, more than one oxygen moiety of a phosphate ligand may be coordinated to each hafnium ion and form bi- or poly-dentate complexes at the surface of the high-k dielectric layer 312.

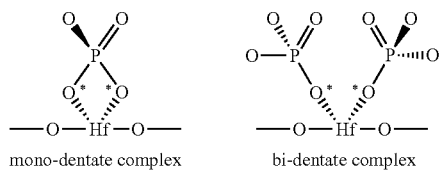

mono-dentate complex    bi-dentate complex

Accordingly, the high-k dielectric layer 312 is chemically tethered to the high-k dielectric layer 304 via the phosphate-containing monolayer 310, such that material (e.g., $La_2O_3$) included in the high-k dielectric layer 304 is confined to the interfacial layer 302 and prevented from diffusing past the high-k dielectric layer 312. Advantageously, the present disclosure provides a method of chemically bonding a second high-k material (e.g., the high-k dielectric layer 312) to a first high-k material (e.g., the high-k dielectric layer 304) via a self-assembled monolayer (e.g., the phosphate-containing monolayer 310) implemented by a wet etching apparatus without utilizing any lithography or patterning processes. In other words, the present disclosure provides a gate dielectric layer that includes two high-k dielectric layers (e.g., the high-k dielectric layer 304 and the high-k dielectric layer 312) chemically tethered together by the phosphate-containing monolayer 310.

Figure 11B:
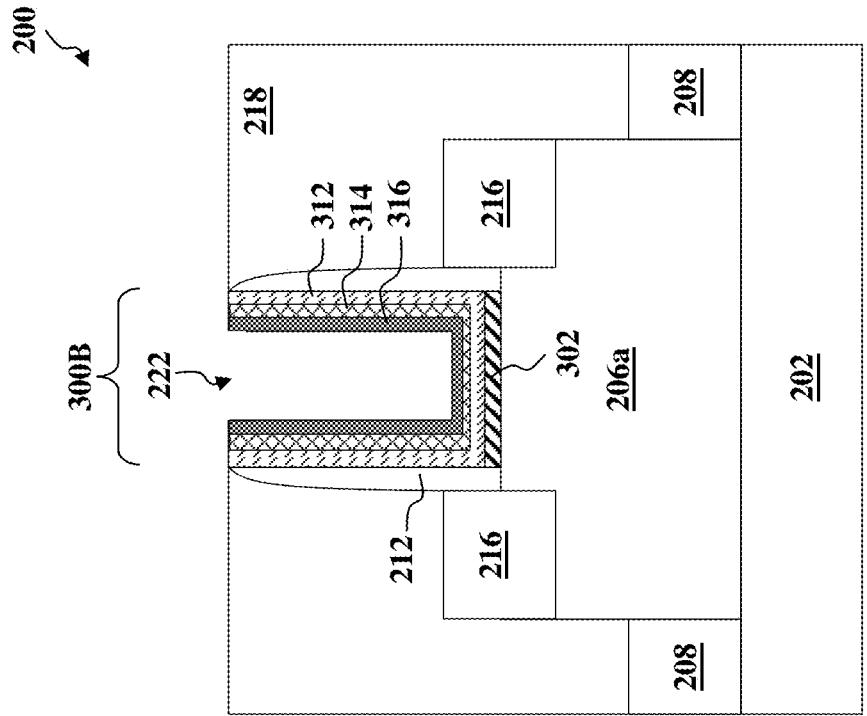
Figure 11A:
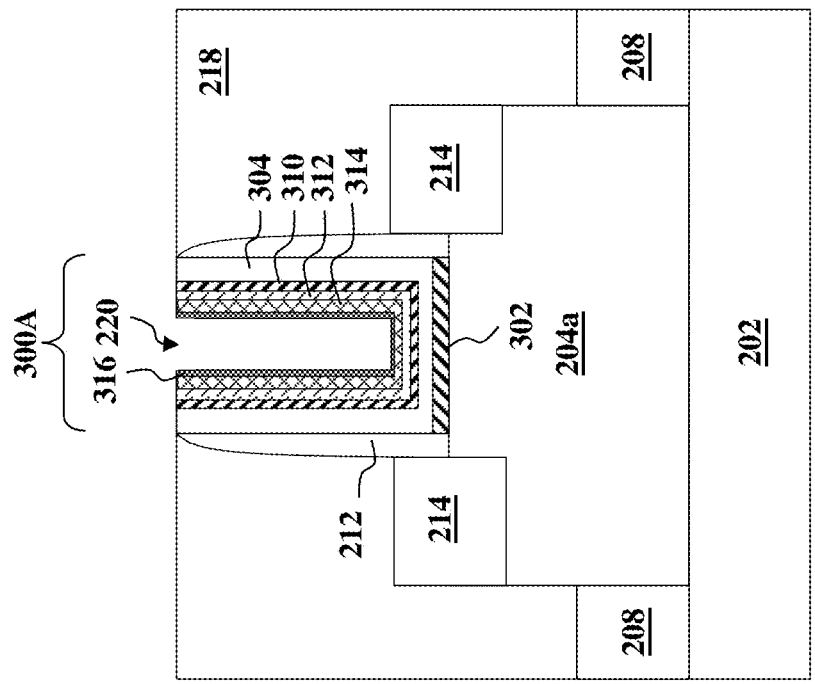
Figure 11C:
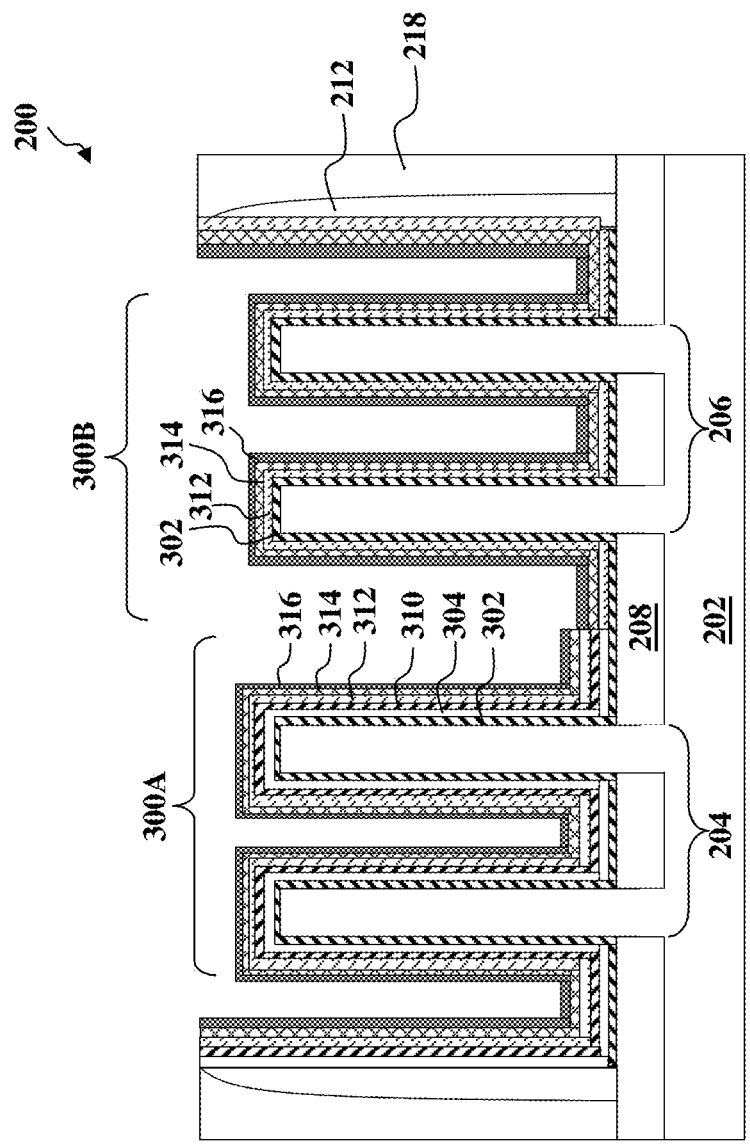

Referring back to FIG. 1B, the method 100 then proceeds to operation 120 to form a capping layer 314 over the high-k dielectric layer 312 in the HK MGs 300A (FIGS. 11A and 11C) and 300B (FIGS. 11B and 11C). In many embodiments, the capping layer 314 is configured to protect the underlying high-k dielectric layer 312 from subsequent thermal processes. The capping layer 314 may include a metal nitride, such as TiN, TaN, NbN, or other suitable materials and may be formed by a deposition process such as ALD, CVD, PVD, and/or other suitable processes. The capping layer 314 may be formed to any suitable thickness, such as less than 20 Angstroms. In at least one embodiment, the capping layer 314 is formed to a thickness of about 5 Angstroms to about 15 Angstroms.

Thereafter, still referring to FIGS. 11A, 11B, and 11C, the method 100 at operation 122 forms a barrier layer 316 over the capping layer 314. In many embodiments, the barrier layer 316, also known as a metal barrier layer or a metal blocking layer, is configured to protect the underlying high-k dielectric layer 312 from metal impurities introduced in subsequent fabrication processes, such as metal patterning processes for forming subsequent work function metal layers. For example, without the barrier layer 316, metal materials from subsequently formed work function metal layers can diffuse into the high-k dielectric layer 312, causing manufacturing defects. In various embodiments, the barrier layer 316 includes a metallic element. The barrier layer 316 may include a metal nitride, such as TaN, TiN, NbN, or other suitable materials, and may be formed by a deposition process such as ALD, CVD, PVD, and/or other suitable processes. The barrier layer 316 may be formed to any suitable thickness, such as less than 20 Angstroms. In at least one embodiment, the barrier layer 316 is formed to a thickness similar to that of the capping layer 314. In many embodiments, the barrier layer 316 includes a different material from the capping layer 314.

Referring to FIGS. 1B and 12A-12C, the method 100 at operation 124 forms a work function metal layer 318 in the trench 220. The work function metal layer 318 may be a p-type or an n-type work function metal layer. Exemplary p-type work function metals include TiN, TaN, Ru, Mo, Al, WN, $ZrSi_2$, $MoSi_2$, $TaSi_2$, $NiSi_2$, WN, and/or other suitable p-type work function materials. Exemplary n-type work function metals include Ti, Ag, TaAl, TaAlC, TiAlN, TaC, TaCN, TaSiN, Mn, Zr, and/or other suitable n-type work function materials. The work function metal layer 318 may include a plurality of layers and may be deposited by ALD, CVD, PVD, and/or other suitable process. In at least one embodiment, the work function metal layer 318 is selectively formed in the trench 220 and includes a p-type work function material that is suitable for forming a p-type FET device. In many embodiments, the work function metal layer 318 is formed by first depositing the work function metal layer 318 in both of the trenches 220 and 222, and then removing a portion of the work function metal layer 318 in the trench 222 by a series of lithography and patterning processes similar to those described with respect to operation 114. Alternatively, the work function metal layer 318 may be formed in the trench 222 by a similar process.

Figure 12C:
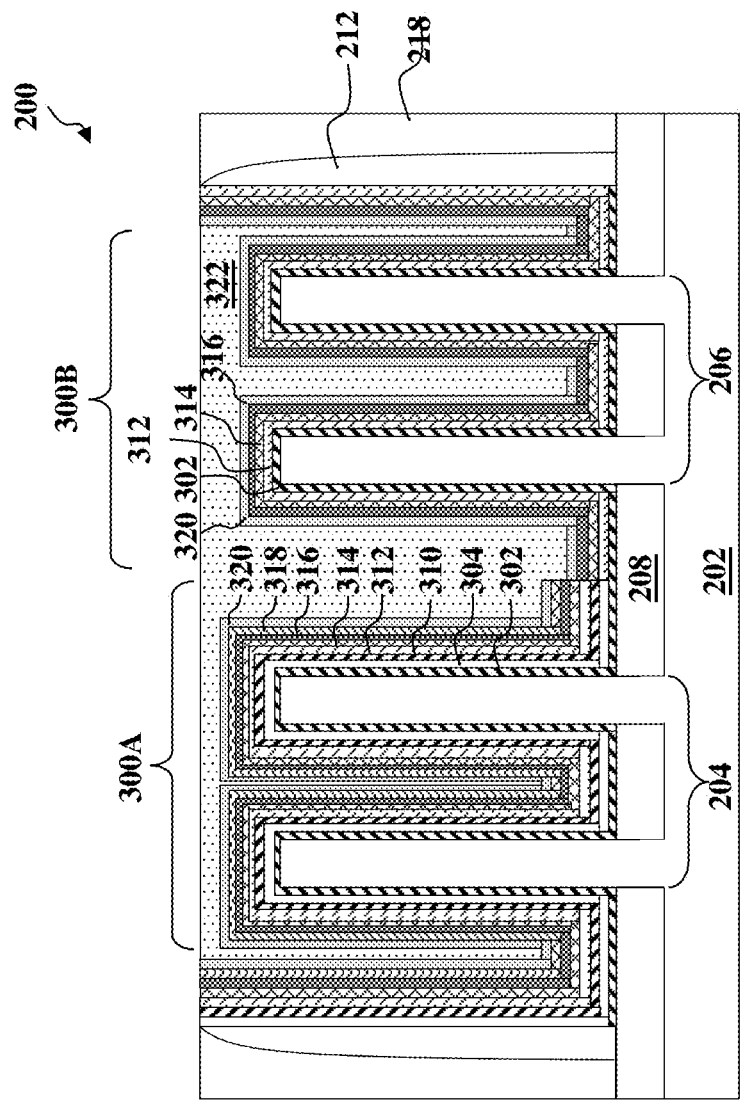

Still referring to FIGS. 12A-12C, the method 100 forms a work function metal layer 320 in the trench 220, the trench 222, or both. Similar to the work function metal layer 318, the work function metal layer 320 may be an n-type or a p-type work function metal layer. In some embodiments, the work function metal layer 320 is selectively formed in one of the trenches 220 and 222. In other embodiments, the work function metal layer 320 is formed in both of the trenches 220 and 222. In further embodiments, the work function metal layer 320 may be formed before or after forming the work function metal layer 318. The choice of the type of work function metals to be included in the work function metal layers 318 and 320 may be determined by an overall threshold voltage $V_t$ desired for the specific FET device (e.g., n-type or p-type) formed in the first region 204 and the second region 206 (FIG. 2). In some embodiments, the work function metal layer 320 and the work function metal layer 318 are of similar semiconductor types (i.e., both of n-type or both of p-type). In alternative embodiments, the work function metal layer 320 and the work function metal layer 318 are of different semiconductor types (i.e., one being of n-type and the other being of p-type). In many embodiments, additional work function metal layers are formed over the work function metal layers 318 and/or 320.

Thereafter, referring still to FIGS. 12A-12C, the method 100 at operation 128 forms a bulk conductive layer 322 in the remaining spaces of the trenches 220 and 222 to form HK MGs 300A and 300B, respectively. The bulk conductive layer 322 may include copper (Cu), tungsten (W), aluminum (Al), cobalt (Co), and/or other suitable materials. The bulk conductive layer 322 may be formed by ALD, CVD, PVD, plating, and/or other suitable processes. A CMP process may be performed to remove excess materials from the HK MGs 300A and 300B so as to planarize a top surface of the device 200.

Generally, threshold voltage $V_t$ of a HK MG may be modulated by adjusting a thickness of each work function metal layer (e.g., the work function metal layers 318, 320, and/or other additionally formed work function metal layers) included therein. However, as feature sizes decrease, controlling thicknesses of multiple work function metal layers during lithography and patterning processes poses many challenges. The present disclosure provides a method of modulating the threshold voltage $V_t$ of a HK MG by tuning properties of the gate dielectric layer using a self-assembled monolayer instead of and/or in addition to adjusting the properties of the work function metal layers. In at least one embodiment, the threshold voltage $V_t$ may be modulated by forming a gate dielectric layer that includes a first high-k dielectric layer (e.g., the high-k dielectric layer 304) chemically bonded to another high-k dielectric layer (e.g., the high-k dielectric layer 312) via a phosphate-containing monolayer (e.g., the phosphate-containing monolayer 310) formed by a wet etching process. In an example, forming the high-k dielectric layer 304 that includes $La_3O_3$ over the interfacial layer 302 in the HK MG 300A and/or 300B may reduce the threshold voltage $V_t$ of the HK MG 300A and/or 300B, causing the overall device to behavior more similar to an n-type FET than to a p-type FET. Furthermore, using the phosphate-containing monolayer 310 to confine the high-k dielectric layer 304 that includes $La_3O_3$ may ensure the result of such modulation by preventing $La_3O_3$ from diffusing past the interfacial layer 302 and/or the high-k dielectric layer 312 in the HK MG 300A and/or 300B, thereby improving interface dipole engineering. Still further, the present disclosure provides a method of immobilizing a high-k dielectric layer (e.g., the high-k dielectric layer 304) to other HK MG material layers, such as the barrier layer 316, via the phosphate-containing monolayer 310 to provide additional modulation capability to fine-tune the performance of the HK MGs 300A and 300B.

Subsequently, at operation 130, the method 100 performs additional processing steps to complete fabrication of the device 200. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof. For example, embodiments of the present disclosure provide methods for patterning a high-k dielectric layer over an interfacial layer during a HK MG replacement process. According to the present disclosure, a gate dielectric layer including a first high-k dielectric layer, which includes lanthanum and oxygen, chemically bonded to a second high-k dielectric layer via a phosphate-containing monolayer is formed over and interfacial layer, providing capability to modulate threshold voltage of the HK MG instead of and/or in addition to adjusting work function metal layers included in the HK MG. By chemically tethering the second high-k dielectric layer to the first high-k dielectric layer, the first high-k dielectric material is confined to the interfacial layer, ensuring that a desired threshold voltage is achieved.

In one aspect, the present disclosure is directed to a method of forming a semiconductor device. The method includes removing a dummy gate structure formed over a first fin and a second fin, forming an interfacial layer over the exposed portion of the first fin in the first trench and over the exposed portion of the second fin in the second trench, forming a first high-k dielectric layer over the interfacial layer in the first trench and the second trench, removing the first high-k dielectric layer in the second trench, forming a self-assembled monolayer (SAM) over the first high-k dielectric layer in the first trench, forming a second high-k dielectric layer over the phosphate-containing monolayer in the first trench and over the interfacial layer in the second trench, forming a work function metal layer in the first trench and the second trench, and forming a bulk conductive layer over the work function metal layer in the first trench and the second trench. In some embodiments, the removing forms a first trench that exposes a portion of the first fin and a second trench that exposes a portion of the second fin. In some embodiments, the first high-k dielectric layer includes lanthanum and oxygen.

In some embodiments, the method further comprises forming a sacrificial layer over the first high-k dielectric layer in the first trench and the second trench. In further embodiments, the forming the sacrificial layer includes forming a first sacrificial layer over the first high-k dielectric layer, which includes aluminum and oxygen. In still further embodiments, the forming the sacrificial layer further includes forming a second sacrificial layer over the first sacrificial layer, which includes titanium and nitrogen.

In some embodiments, the removing the first high-k dielectric layer removes the sacrificial layer in the second trench. In some embodiments, the forming the SAM removes the sacrificial layer in the first trench. In further embodiments, the removing the first high-k dielectric layer includes performing a wet etching process, which utilizes a solvent mixture including HCl, $H_2O_2$, and $H_2O$.

In some embodiments, the forming the SAM includes performing a wet etching process, which utilizes a phosphate solution. In an exemplary embodiment, the phosphate solution includes $(NH_4)_3PO_4$.

In another aspect, the present disclosure is directed to a method of forming a semiconductor device. The method includes forming a gate structure over a portion of a fin, where the forming the gate structure includes forming an interfacial layer over the portion of the fin, depositing a lanthanum-and-oxygen-containing dielectric layer over the interfacial layer, depositing a sacrificial layer over the lanthanum-and-oxygen-containing dielectric layer, performing a wet etching process to remove the sacrificial layer, thereby forming a phosphate-containing monolayer over the lanthanum-and-oxygen-containing dielectric layer, depositing a hafnium-and-oxygen-containing dielectric layer over the phosphate-containing monolayer, depositing a work function metal layer over the hafnium-and-oxygen-containing dielectric layer, and forming a bulk conductive layer over the work function metal layer.

In some embodiments, the performing the wet etching process includes using a solution including a plurality of phosphate ligands. In further embodiments, each of the plurality of phosphate ligands includes at least one oxygen moiety. In further embodiments, the forming the phosphate-containing monolayer includes forming a coordinated bond between a lanthanum ion included in the lanthanum-and-oxygen-containing dielectric layer and the at least one oxygen moiety. In still further embodiments, the depositing the hafnium-and-oxygen-containing dielectric layer includes forming a coordinated bond between a hafnium ion included in the hafnium-and-oxygen-containing dielectric layer and the at least one oxygen moiety.

In yet another aspect, the present disclosure is directed to a semiconductor structure. The semiconductor structure includes a first fin and a second fin disposed over a substrate, and a first gate structure disposed over the first fin and a second gate structure disposed over the second fin, in which the first gate structure includes an interfacial layer over the first fin, a first high-k dielectric layer over the interfacial layer, a self-assembled monolayer (SAM) over the first high-k dielectric layer, a second high-k dielectric layer over the SAM, a first work function metal layer over the second high-k dielectric layer, and a bulk conductive layer over the first work function metal layer, and the second gate structure includes the interfacial layer over the second fin, the second high-k dielectric layer over the interfacial layer, a second work function metal layer over the second high-k dielectric layer, and the bulk conductive layer over the second work function metal layer.

In some embodiments, the first high-k dielectric layer includes lanthanum oxide. In some embodiments, the second high-k dielectric layer includes hafnium oxide. In further embodiments, the SAM is chemically tethered to lanthanum ions included in the first high-k dielectric layer and hafnium ions included in the second high-k dielectric layer.

In some embodiments, the first work function metal layer and the second work function metal layer are of different semiconductor types. In some embodiments, the first gate structure further includes a third work function metal layer disposed over the first work function metal layer, where the third work function metal layer is similar to the second work function metal layer.

In some embodiments, each of the first gate structure and the second gate structure further includes a barrier layer over the second high-k dielectric layer, the barrier layer including tantalum and nitrogen.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a first fin and a second fin disposed over a substrate; and a first gate structure disposed over the first fin and a second gate structure disposed over the second fin, wherein:
the first gate structure includes an interfacial layer over the first fin, a first high-k dielectric layer over the interfacial layer, a phosphate-containing monolayer over the first high-k dielectric layer, a second high-k dielectric layer over the phosphate-containing monolayer, a first work function metal layer over the second high-k dielectric layer, and a bulk conductive layer over the first work function metal layer, and
the second gate structure includes the interfacial layer over the second fin, the second high-k dielectric layer over the interfacial layer, a second work function metal layer over the second high-k dielectric layer, and the bulk conductive layer over the second work function metal layer.

2. The semiconductor structure of claim 1, wherein the first high-k dielectric layer includes lanthanum oxide.

3. The semiconductor structure of claim 2, wherein the second high-k dielectric layer includes hafnium oxide.

4. The semiconductor structure of claim 3, wherein the phosphate-containing monolayer is chemically tethered to lanthanum ions included in the first high-k dielectric layer and to hafnium ions included in the second high-k dielectric layer.

5. The semiconductor structure of claim 1, wherein the first work function metal layer and the second work function metal layer are of different semiconductor types.

6. The semiconductor structure of claim 1, wherein the first gate structure further includes a third work function metal layer disposed over the first work function metal layer, and wherein the third work function metal layer is similar to the second work function metal layer.

7. The semiconductor structure of claim 1, wherein each of the first gate structure and the second gate structure further includes a barrier layer over the second high-k dielectric layer.

8. A semiconductor structure, comprising:
a first fin and a second fin disposed over a semiconductor substrate; and
a high-k metal gate structure having a first portion disposed over the first fin and a second portion disposed over the second fin,
wherein the first portion includes a first gate dielectric layer disposed over an interfacial layer, a phosphorous-containing layer disposed over the first gate dielectric layer, a second gate dielectric layer disposed over the phosphorous-containing layer, the second gate dielectric layer being different from the first gate dielectric layer, and a first metal electrode disposed over the second gate dielectric layer, and
wherein the second portion includes the interfacial layer, the second gate dielectric layer contacting the interfacial layer, and a second metal electrode contacting the second gate dielectric layer.

9. The semiconductor structure of claim 8, wherein the phosphorous-containing layer includes oxygen moieties.

10. The semiconductor structure of claim 9, wherein the first gate dielectric layer includes lanthanum ions, and wherein the lanthanum ions form coordinated bonds with some of the oxygen moieties of the phosphorous-containing layer.

11. The semiconductor structure of claim 9, wherein the second gate dielectric layer includes hafnium ions, and wherein the hafnium ions form coordinated bonds with some of the oxygen moieties of the phosphorous-containing layer.

12. The semiconductor structure of claim 8, wherein the first metal electrode includes a first work function metal layer disposed over the first gate dielectric layer, wherein the second metal electrode includes a second work function metal layer disposed over the second gate dielectric layer, and wherein the second work function metal layer is of a different semiconductor type from the first work function metal layer.

13. The semiconductor structure of claim 8, wherein the first metal electrode includes a first work function metal layer disposed over the first gate dielectric layer and a second work function metal layer disposed over the first work function metal layer, wherein the second metal electrode includes a third work function metal layer disposed over the second gate dielectric layer, wherein the first and the second work function metal layers are of different semiconductor types, and wherein the second and the third work function metal layers are of the same semiconductor type.

14. A semiconductor structure, comprising:
a metal gate structure (HKMG) disposed over a first fin and a second fin, the first fin and the second fin protruding from a semiconductor substrate, wherein the metal gate structure includes:
a first dielectric layer disposed over the first fin but not over the second fin;
a phosphate-containing layer disposed on the first dielectric layer;
a second dielectric layer disposed over the first fin and the second fin, wherein the second dielectric layer contacts the phosphate-containing layer, and wherein the second dielectric layer is different from the first dielectric layer in composition; and
a bulk conductive layer disposed over the second dielectric layer.

15. The semiconductor structure of claim 14, wherein the first dielectric layer includes lanthanum ions, and wherein the second dielectric layer includes hafnium ions.

16. The semiconductor structure of claim 15, wherein the lanthanum ions of the first dielectric layer chemically bond to phosphate ligands at a first surface of the phosphate-containing layer, and wherein the hafnium ions of the second dielectric layer chemically bond to phosphate ligands at a second surface of the phosphate-containing layer opposite to the first surface.

17. The semiconductor structure of claim 14, further comprising an interfacial layer disposed between the first dielectric layer and the first fin and between the second dielectric layer and the second fin.

18. The semiconductor structure of claim 14, further comprising a first work function metal layer disposed between the bulk conductive layer and a first portion of the second dielectric layer over the first fin, and a second work function metal layer disposed between the bulk conductive layer and a second portion of the second dielectric layer over the second fin, wherein the first work function metal layer differs from the second work function meta layer in semiconductor type.

19. The semiconductor structure of claim 14, further comprising a work function metal layer disposed between the second dielectric layer and the bulk conductive layer.

20. The semiconductor structure of claim 14, wherein a portion of the HKMG disposed over the first fin has a lower threshold voltage that a portion of the HKMG disposed over the second fin.

* * * * *